(12) United States Patent
Sahlman

(10) Patent No.: US 7,460,613 B2
(45) Date of Patent: Dec. 2, 2008

(54) DIGITAL LINEARIZATION CIRCUIT

(75) Inventor: Karl-Gösta Sahlman, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 697 days.

(21) Appl. No.: 10/492,981

(22) PCT Filed: Oct. 29, 2002

(86) PCT No.: PCT/SE02/01958

§ 371 (c)(1), (2), (4) Date: Apr. 16, 2004

(87) PCT Pub. No.: WO03/043183

PCT Pub. Date: May 22, 2003

(65) Prior Publication Data

US 2004/0247042 A1 Dec. 9, 2004

(30) Foreign Application Priority Data

Nov. 12, 2001 (SE) .................................... 0103745

(51) Int. Cl.
H04L 25/49 (2006.01)

(52) U.S. Cl. ...................................... 375/296

(58) Field of Classification Search .......... 375/295–297
See application file for complete search history.

(56) References Cited

U.S. PATENT DOCUMENTS

| | | | |
|---|---|---|---|
| 4,291,277 A | | 9/1981 | Davis et al. |
| 4,855,737 A | * | 8/1989 | Poole .......................... 340/933 |
| 5,049,832 A | | 9/1991 | Cavers |
| 5,218,620 A | * | 6/1993 | Mori et al. ................... 375/142 |
| 5,272,721 A | * | 12/1993 | Mikoshiba et al. .......... 375/150 |
| 5,417,114 A | * | 5/1995 | Wadaka et al. ............... 73/602 |
| 5,485,120 A | | 1/1996 | Anvari |
| 5,500,871 A | * | 3/1996 | Kato et al. .................. 375/146 |

(Continued)

OTHER PUBLICATIONS

Cavers, "Amplifier Linearization Using a Digital Predistorter with Fast Adaptation and Low Memory Requirements," IEEE Transactions on Vehicular Technology, vol. 39, No. 4, Nov. 1990, pp. 374-382.

(Continued)

*Primary Examiner*—Kevin M Burd
(74) *Attorney, Agent, or Firm*—Nixon & Vanderhye, P.C.

(57) ABSTRACT

A solution is disclosed for achieving a functional complex base-band adaptive digital nonlinear device model providing RF-power amplifier distortion (i.e. linearization or pre-distortion) minimizing distortion characterization including memory effects. The present inventive solution is based on real device non-linear performance observations and the physical cause for the distortion is compensated in the application. This also means that a pre-distorter digital circuit is derived to have the inverse functionality of the digital device model. The model and the digital pre-distortion circuit are designed in such way, that function blocks are connected in cascade. Each function block is then designed to handle a certain type of distortion performance and can be optimized individually. The model gives possibilities to describe and evaluate different device properties. An accurate AM to AM and AM to PM characterization can be evaluated and the frequency response of the device when excited with envelope-modulated signals can be evaluated. The properties evaluated can also be used in a test procedure in a production facility to verify production quality.

20 Claims, 23 Drawing Sheets

U.S. PATENT DOCUMENTS

| | | | |
|---|---|---|---|
| 5,724,381 A * | 3/1998 | Endo et al. | 375/149 |
| 5,774,494 A * | 6/1998 | Sawahashi et al. | 375/152 |
| 5,856,998 A * | 1/1999 | Durrant et al. | 375/150 |
| 5,923,712 A * | 7/1999 | Leyendecker et al. | 375/297 |
| 5,949,283 A | 9/1999 | Proctor et al. | |
| 5,959,500 A | 9/1999 | Garrido | |
| 6,005,903 A * | 12/1999 | Mendelovicz | 375/367 |
| 6,246,286 B1 | 6/2001 | Persson | |
| 6,545,535 B2 * | 4/2003 | Andre | 330/149 |
| 6,741,662 B1 * | 5/2004 | Francos et al. | 375/297 |
| 2006/0034448 A1 * | 2/2006 | Parry | 379/406.01 |

OTHER PUBLICATIONS

Wright et al., "Experimental Performance of an Adaptive Digital Linearized Amplifier," IEEE Transactions on Vehicular Technology, vol. 41, No. 4, Nov. 1992, pp. 395-400.

* cited by examiner

PRIOR ART

Phasor Multiplier

US 7,460,613 B2

DIGITAL LINEARIZATION CIRCUIT

This application is the U.S. national phase of international application PCT/SE02/01958 filed 29 Oct. 2002 which designated the U.S. and claims benefit of SE 0103745-6 dated 12 Nov. 2001, the entire content of which is hereby incorporated by reference.

TECHNICAL FIELD

The technical field of the present disclosure relates to a method for achieving a functional Digital circuit to provide RF-power amplifier distortion minimization (i.e. linearization or pre-distortion) being based on a real device non-linear performance observations and the physical cause for the distortion to be compensated.

BACKGROUND

Mobile communication systems, such as those used for cellular telephone communication, divide the spectrum into a multiplicity of individual signaling channels or frequency bands. Particular channels are allocated to individual users as they access the system. Each user's communication path is routed through the system through the channel allocated to that user. Signals broadcast by the system must be carefully regulated so that they remain within the channels allocated to the various users. Signals "out of band" can spill over from one channel to another, causing unacceptable interference with communications in the other channels. In order to increase the data transfer in such channels linear modulations like QAM, 8-PSK and others containing amplitude modulation are utilized in contrary to older systems using constant amplitude phase or frequency modulation. The new 3G systems will need multi-carrier amplifiers. Those new modulations require high linearity amplifiers and up-converters not to cause interference to other channels in the cellular system. Although combining of a plurality of carriers of any modulation into a single RF-power amplifier (MCPA) means that the amplifier will require very high demand on linearity in order to avoid spectral re-growth spreading RF-power into regions of the spectrum not appearing in the input signal.

Normal RF-power linearization techniques are utilizing the known Feed-Forward, technique, (FF) and variants thereof. In order to improve the performance of the concept various attempts of improving the FF-architecture by pre-distorting the signal to the main power amplifier are utilized. This is done to reduce the distortion in the main amplifier before applying the correcting signals in the feed forward loop thus achieving better efficiencies and less correcting needed in the FF-loop. Examples of such patents are WO97/37427, WO99/23756, WO99/45640 and WO99/45638 which shows a general increase of analogue complexity of generating the pre-distortion signals to the Main Power amplifier in a Feed-Forward Application or only using pre-distortion linearization of an RF-amplifier without the feed-forward loop for less demanding applications. With the semiconductor technology improving in both DSP- and ADC- and DAC-techniques a strive has been taken of doing the pre-distortion in the digital domain instead of the analogue. Various patents on digital predistortion have been filed. First the digital pre-distortion patents were covering linear modulation single carrier amplifier improvements. References to be mentioned here are U.S. Pat. No. 4,291,277, U.S. Pat. No. 5,049,832 et al. Technical articles like James Carver—IEEE Transactions on Vehicular technology, Vol. 39 No. 4, November 1990: "Amplifier Linearization using Digital Pre-distorter with fast adaptation and Low Memory requirements" and Andrew S. Wright and Willem Durtler, IEEE Transactions on Vehicular technology, Vol. 41, No. 4, November 1992: "Experimental Performance of an adaptive Digital Linearized Power Amplifier" gives good insight in the preceding history for the evolution of Digital Pre-distortion. In FIG. 1 is illustrated a digital pre-distorter outline as described by Carvers et al.

RF-power amplifier multi-carrier power amplifiers (MCPA) require very high demand on linearity in order to avoid spectral re-growth spreading RF-power into regions of the spectrum not appearing in the input signal. In analogy with the known analogue feed-forward technique, different patents of digital pre-distortion and post-distortion implementations are disclosed in for instance patent documents WO97/30521, WO98/51005, U.S. Pat. No. 5,923,712 by Leyondecker on WO98/12800.

FIG. 2 shows a basic outline for a digital pre-distortion (DPD) application applied to a wireless system. However, DPD can be applied to other systems needing digital linearization. The mentioned patents deals with the implementation of the so called digital real time circuit and then in smaller content with the calculation routines (algorithms) used in the DSP for up-dating look-up tables and other steering parameters. A practical design must take care of both the hardware and the software for the ease of the practical implementation.

All mentioned patents relies on the basic structure illustrated in FIG. 1 with some functional additions to handle and compensate for more than the basic gain and phase non-linearity transfer function, that a real physical device has. The digital model for the non-linear device like an amplifier (PA) must incorporate models containing more dimensions of data taking account for the so called "Memory effects". By integration of the input signal over a certain time a measure of the input signal Peak to Average signal level is made. This is then utilized to create tables describing the device performance dependence not only dependent of the actual input signal strength. The patent document WO98/12800 from Spectrian describes one way of from measured amplifier performance by use of a so called "leaky integrator" get information of the moving average magnitude of the signal and from that create a function to describe the performance of the amplifier combined into one table. The Spectrian patent used the signal magnitude as input to the "leaky integrator", which is basically wrong as the claims are for power dependence. The "leaky integrator" shall work on the squared magnitude representing the signal power instead. The above mentioned patent as well as U.S. Pat. No. 5,949,283 and U.S. Pat. No. 5,959,500 are different implementations of how to create tables from observations of the amplifier output signal. The observations are used to create tables to pre-distorted input signals to the amplifier in order to improve the distortion at the output of the amplifier. By adding complexity in the pre-distorters the look-up table (LUT) dimension are often increased drastically. The patents also deals with the scenarios of using the created look-up tables to create signals to be used as a post-distortion that is subtracted from the main amplifier by another amplifier up-converter at the output of the main amplifier. This adds complexity to the solutions.

The disclosed embodiments can apply to the design of the digital parts needed to make distortion cancellation of a non-linear device like a RF-power amplifier (PA) and the algorithms for achieving the results. The power amplifier is considered to be the non-linear device for the rest of this paper. Different outlines and patents have been granted for this issue. Worth mentioning is the following. The results achieved in those patents are that very large multidimensional memory size is needed and the algorithms for calculating the needed memory contents are unclear. The available distortion cancellation in applying these patents are also unknown as the structures and algorithms contaminate different PA performances of a real device like phase delay, power dependence and bias dependence in the same function blocks of the implemented digital block diagrams. U.S. Pat. No. 5,923,712 describes a method of tables containing extracted several weighting taps in some peculiar manner combining both power and magnitude samples with different delays to decide some average performance. The result is combined with direct inverse pre-distortion modeling. FIG. 8 in U.S. Pat. No. 5,923,712 shows how complex the implementation becomes for a practical case if memory predictions are going to be used. Multidimensional tables are also implemented for power dependence predictions disclosed in other patents.

The basic for all these patents are that the compensating gain calculations to be put into the LUT is done by a direct inverse division of the observed RF-power output signal and a time delayed (adjusted) input signal. There are a lot of special designed algorithms needed to be applicable to each particular patent for improving the basic failures from direct inverse calculations and the particular outlines used like signal noise sensitivity reduction and algorithm convergence.

Thus there is still a need for an efficient method for providing RF-power amplifier distortion minimizing (i.e. linearization or pre-distortion). Therefore one or more of the disclosed embodiments do not perform direct inverse calculations as outlined above and which will be explained in the remainder of this document.

SUMMARY

In one aspect, a solution for achieving a functional Digital circuit to provide RF-power amplifier distortion minimizing (i.e. linearization or pre-distortion) is based on read device non-linear performance observations and the physical cause for the distortion is compensated. A base-band digital model for a non-linear device is extracted and the pre-distorter digital circuit is derived to have the inverse functionality of the digital device model. The model and the digital pre-distorter circuit are designed in such way, that function blocks are connected in cascade. Each function block is designed to handle a certain type of distortion performance and can be optimized individually.

In a first embodiment, a non-linear device modeling method results in a digital base-band representation of a device, with the capability of optimizing the model validity for each modeled characteristic of the non-linear device used. The model gives possibilities to describe and evaluate different device properties. An accurate AM to AM and AM to PM characterization can be evaluated. The frequency response of the device when excited with envelope-modulated signals can be evaluated. The thermal time responses can be found. The properties evaluated can be used in a test procedure in a production facility to verify production quality. Device thermal mounting failures can be evaluated as one example.

In a second embodiment, the digital pre-distorter function blocks are built as the inverse functionality of the real PA device performance based on real device characterizations. The digital functionality is designed as functional blocks aligned in cascade for the signal to pass through. The blocks are designed in such a way that different function blocks can each be assigned to different performance descriptions of a real power amplifier. Depending on performance demand the functional blocks can be enabled or disabled. The algorithms for calculating the block parameters are based on modern signal processing techniques for DSP application. The basic digital circuit solution is scalable in functions. This indicates that for moderate demands a smaller part of the blocks can be used and a smaller part of the algorithms calculated in the Digital Signal Processor (DSP). Multidimensional memory LUT is not needed in any function block.

The solution also makes it possible to correct for the introduced group delay errors within the signal bandwidth that prior art solutions for digital pre-distortion application will not be able to correct for.

According to a third embodiment, for the ease of DSP implementation and reducing the memory need for the programs, only a few basic reusable algorithms are used for calculation and for up-dating the different function blocks of the new digital pre-distorter or for calculation of a non-linear device digital model characteristics. These algorithms are used both for signal time alignments, memory effect calculations and LUT table update calculations.

According to still a fourth embodiment, with new modern digital signal processing algorithms applied to the DPD circuit disclosed, the basic digital function block as outlined in FIG. 1, and in prior art regarded as a "Memory-less digital pre-distorter" can be made to function as a "Digital Pre-Distorter with Memory Compensation".

SHORT DESCRIPTION OF THE DRAWINGS

The principles of the invention, together with further objects and advantages thereof, may best be understood by making reference to the following description taken together with the accompanying drawings, in which:

FIG. 16c illustrates a flow chart for model calculation for the result shown in FIG. 16b and the enhanced digital model blocks are numerically designated "Block 1" to "Block 3" according to FIG. 16a;

DETAILED DESCRIPTION OF THE INVENTION

Figure 1:
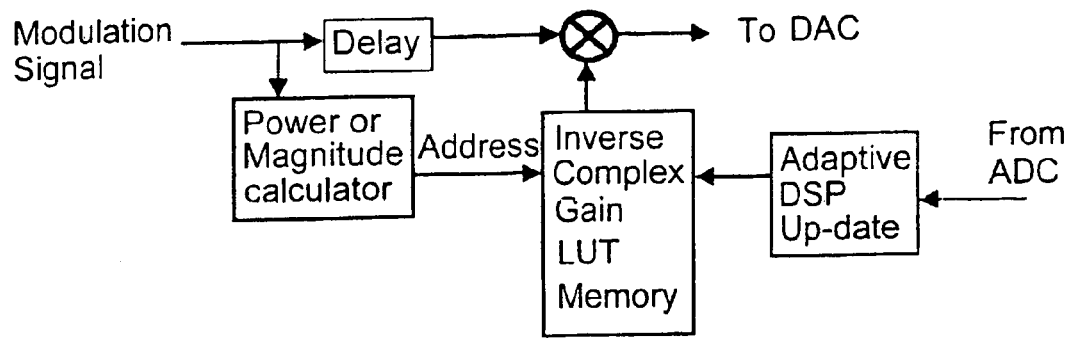
FIG. 1 illustrates a basic AM to AM and AM to PM pre-distorter block (Prior Art)

In order to define a well functioning digital pre-distorter, the performance of the non-linear device named (PA) should be known. Therefore the PA performance should be known by measurements and a digital base-band PA model described as function of the real vector I and the imaginary vector Q samples of the input digital signal designed accordingly. Model characterization is done by down loading of a defined range of samples in time of the input signal and an equal range of samples of the digital measurements of a real Power Amplifier or other non-linear device. The signal errors between the digital model and the actual measurement of the real device signals are normally estimated as the performance that a digital pre-distortion application can achieve, if it is designed according to the modeled device.

For explanation purposes, a first part of the disclosure describes in detail a derivation of a cascade of function block in the PA-model feasible for digital base-band representation of a real PA, based on the understanding of the physical cause for different non-linear distortions emerging from a real circuit. The algorithms applied are based on modern digital signal processing techniques and not on internally invented optimization routines in order to get the prior art digital pre-distorters to work. The examples in this derivation are done by showing measurements using a commercial test set-up and a company power amplifier capable of delivering more than 300 W peak power.

Next the proposed digital pre-distortion circuit is outlined as the inverse function of the PA-model with the complete functionality applied.

Performance simulations are shown of a minimum pre-distorter simulation according to a fourth embodiment in order to show the performance improvement, which is made possible compared to prior art digital pre-distorters mentioned in referenced patents based on direct inverse gain calculation algorithms compared to the algorithms used in one or more embodiments.

PA Digital Model Derivation

The distortion of a PA can be regarded to emerge from different factors and can be assigned to different phenomena.

I) AM to AM and AM to PM non-linearity from the used device

II) Linear Memory Effects emerging from time and phase delays in the actual circuit matching networks and the bias supply and the device. This can be considered as the envelope response of the device.

III) Non-linear Memory effects of the device such as input power and temperature dependence and the input signal dependency of changes in device voltages.

The first type of distortion is normally handled by the Inverse Gain compensation as for the memory-less DPD described in prior art.

The second category, the Linear Memory effect is missed, when prior pre-distorters use the direct inverse gain calculations by dividing the input signal with the measured signal. The prior art patents show different ways of trying to describe these phenomena. A way to handle and describe the second type of phenomena will be shown in the performance evaluation described below when describing a sample simulation of a PA+DPD performance difference between the invention and prior art techniques according to the fourth embodiment.

The third category of memory effects is the most difficult one to describe, but the described approach gives possibilities to characterize this behavior and apply pre-distortion solutions for signal power dependence and further improvements such as power supply clipping if needed.

Power Amplifier Measurement Techniques

A person normally skilled in the art will realize that the performance of the total system for digital pre-distortion application relies very much on the actual design of the measurement device.

Figure 2:
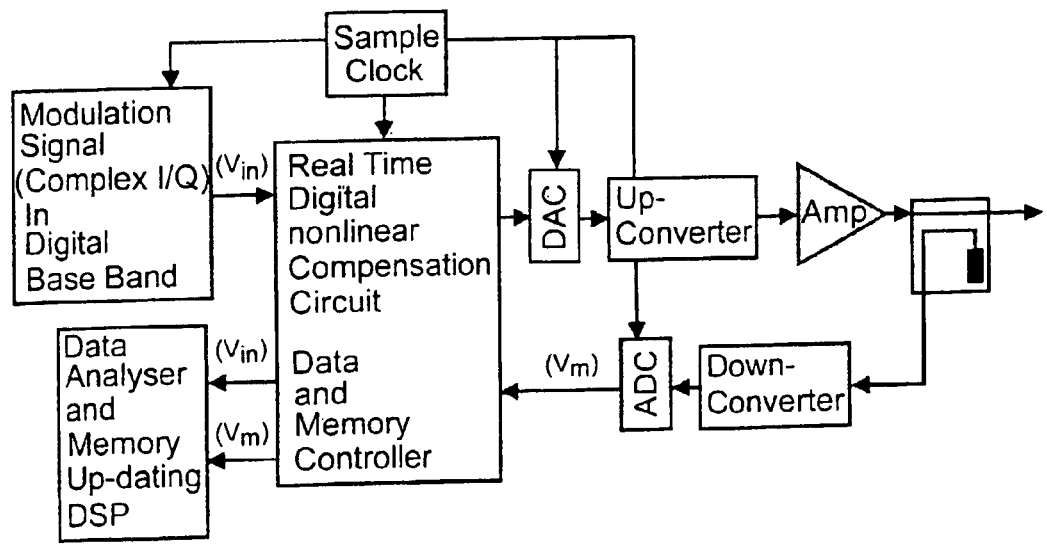
FIG. 2 illustrates a Digital Pre-distortion application (Prior art)

In FIG. 2, which describes a typical DPD application, the measurement device is the down-converter and the ADC. The closed loop system achieved by using digital adaptation will also compensate for the inaccuracies in the measurement device if the measurement device is un-calibrated.

Figure 3:
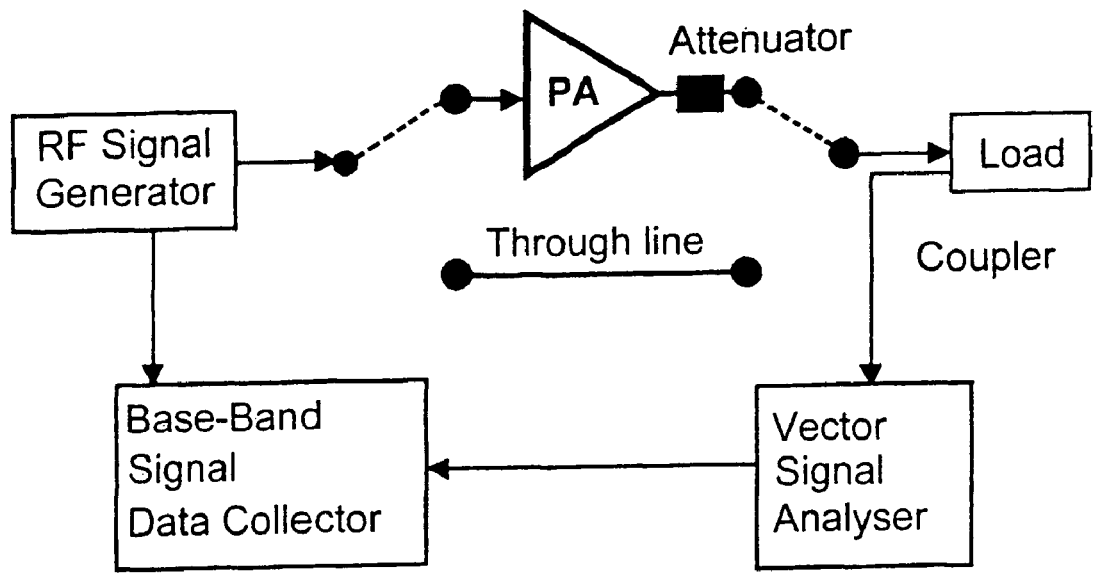
FIG. 3 illustrates an evaluation schematic for PA-model characterization.

FIG. 3 is an outline for measurements intended for non-linear device characterization and digital model evaluation. Commercial available signal generators and Vector Signal analyzers can be used. The signal generator creates a modulated test signal. With this test procedure the same measurement errors are present both in the input signal tested by using the "through line" and by testing the "Power Amplifier and Attenuator" performance by using the same stimuli signal from the signal generator. The complex signals are sampled and provided to a data collection unit. The output and input signals are then exported to a processor for analysis and PA-model evaluation. The basic structure illustrated in FIG. 2 can also be changed to this type of measurement system by introducing the same type of switches into the outline.

In the present disclosure the measurements shown are performed on a 1-carrier WCDMA signal as the input signal, due to the bandwidth limitation of commercial equipment. However, several types of amplifiers have been tested. Evaluations of the measurements showed that the disclosed method was applicable to all of the devices measured. There were differences shown in both type 2 and type 3 performances of the tested devices. The higher output power capability of the tested device, the more of input signal actual power dependence was shown.

Gain Model For the PA Representation

Figure 4A:
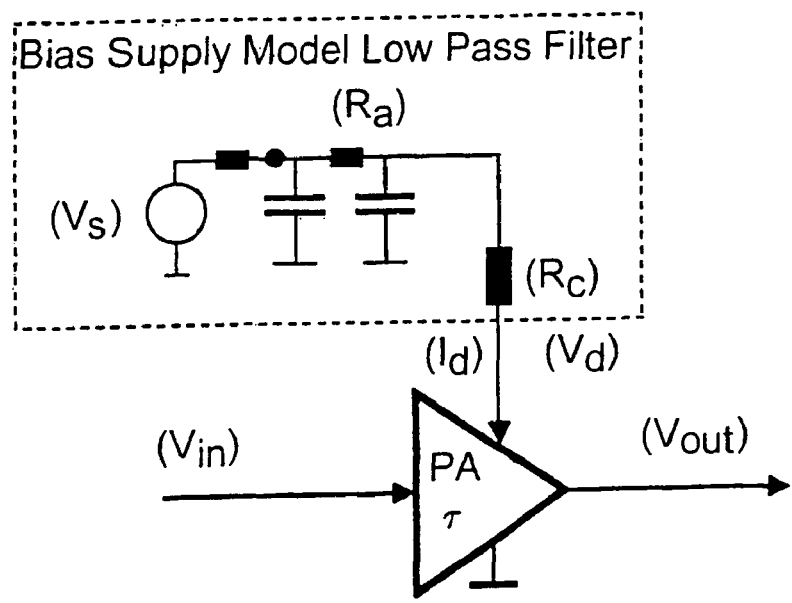
FIG. 4a illustrates a power amplifier with a bias supply circuit.
Figure 4B:
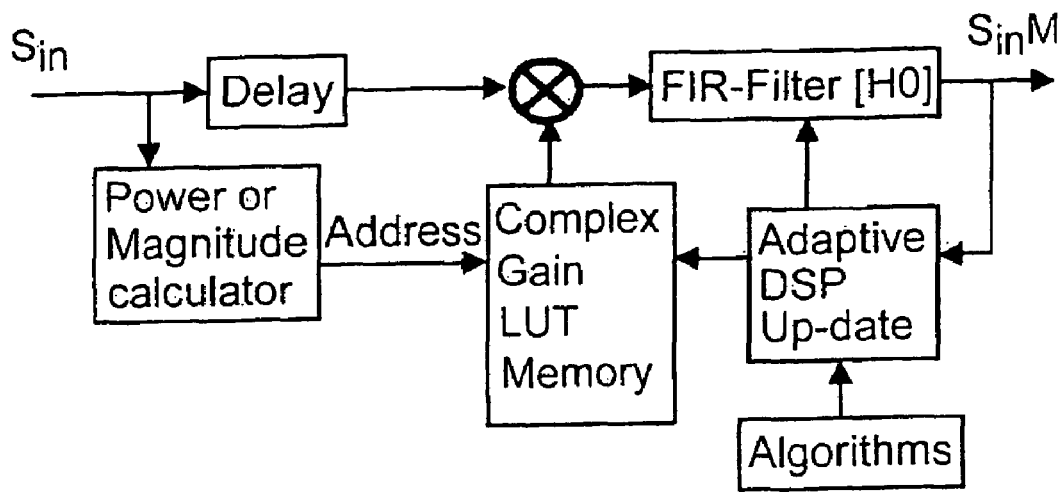
FIG. 4b illustrates a digital model representation with a FIR-filter and arrangement for multiplying an input signal by a Complex Gain Table LUT.

FIGS. 4a and 4b are the basis for deriving the model representation in the present disclosure. In FIG. 4a the bias supply circuit of a device is also shown. There are some de-coupling capacitors of the bias supply lines and there are resistive losses in cables and circuit board lines to the device. This means that the device is not driven by an ideal voltage source, but more likely by a voltage source with nonzero resistance followed by a low-pass filter. This means that there is some delay introduced in the device current when the input signal changes in magnitude. Also the device itself has a step response that introduces a delay. Although a normal gain versus frequency response measurement on a network analyzer shows very flat gain response on a device, the non-linear device response for a digitally modulated input signal with envelope variation will be bandwidth limited. The first thing is then to describe the introduced delays for a real PA hardware by adding a Low-pass filter to the digital time-band model of the PA, taking care of the introduced phase delays. The low pass filter is implemented as a FIR-filter or other type of digital filter. Only a few taps of this filter are needed, as the main purpose is to describe an average approximated delay of the PA signal. This delay is the main contributor to different side-band levels at the high side and the low side of the output distortion, when measuring a practical PA with a spectrum analyzer. Due to the delay, the high frequency side distortion is always higher than at the low frequency side. The new PA-model for digital base-band is shown in FIG. 4b. This model representation gives possibilities to describe the bias supply low pass influences in the model and also other delays.

PA Model FIR-Filter Calculation

To characterize the filter used in the model, the equalizer filter algorithms and methods known from digital receiver technologies are used. The FIR-filter is referred to as H0 in FIG. 4b in this description. Looking at FIG. 4b, the input signal multiplied by the Complex Gain Table LUT weight results in a signal denoted $S_{in}\_GC$, which is used for a comparison with the measured PA output signal. The filter Tap Coefficients are found by solving the convolution equation with time aligned signals with the PA output signal on time sample basis.

Then the equations of the filter convolution: $S_{in}\_GC \otimes H0 = V_{out}$ is solved for the H0 tap values.

Normally the input signal in the discrete time convolution $S_{in}\_GC$ is written as a matrix and H0 and $V_{out}$ as vectors, and the H0 FIR tap values are solved by matrix mathematics. The achieved H0 FIR-filter gain at zero frequency is adjusted equal to 1 in order not to change the magnitude gain of the model affecting the LUT absolute gain values. When few taps are used in the H0-filter, the so named "Equalizer FIR-filter", the matrix equation acts as a least square approximation of the solution. The filter taps are defined from more equations than needed. The equalization thus also gives noise suppression in the signals as the result. The actual equalizer filter algorithm used here is designed in such way that the filter group delay is centered at the mid-tap of the FIR-filter and an odd number of taps are used to achieve sample time aligning. A number of 3 or 5 taps in the filter will normally work very well in a normal application, although there is no limitation in a practical implementation.

Then a convolution of the input signal $S_{in}\_GC$ with the derived FIR-filter is calculated in the processor and the resulting signal is used for the complex gain calculations by comparing with the measured PA output signal. The FIR-filter application gives an accurate weighting for calculation of a complex gain table LUT for device characterization. This calculated complex gain LUT can be used in a digital pre-distorter application if the inverted gain values for the complex gain are applied in a LUT-memory. The implementation of an equalizer FIR-filter algorithm gives far better result in weighting of the data for calculations than the prior art direct signal samplings and inverse gain implementations by division of the signals described for instance in patent WO98/51047. The inventors realized that there are some delay associated with a real non-linear device that a pre-distorter has to compensate for and tried to add more time delayed sampling of signals into the DPD block structures. A linear interpolation approximation used in prior art by sampling at two times or more gives only minor improvements and normally results in multidimensional table LUT memories as seen in mentioned patents by Leyondecker et al.

Using the direct inverse gain evaluation in prior art without filter equalization of the signals used for inverse complex gain table calculations will mean that the digital adaptation of up-dating the LUT tables will converge to non optimum result. The result is that the output signal after digital predistortion shows unequal side band level suppression of the distortion in Prior art implementations. Prior art can only work on special PA-designs with very low memory effects. Using the equalization filter also reduces the noise in the data's used for calculating the LUT table values. Some shortcomings of prior art solutions are shown below in this description.

Basic Digital Pre-Distorter (DPD) for Gain and Phase Distortion Reduction

In this chapter the algorithms and methods for applying the derived digital PA-model in FIG. 4 used in an inverse manner as a DPD will be explained. A sample simulation in the end of this chapter will show the differences between the prior art solutions and the solution disclosed in the present invention.

Application Description

Figure 5A:
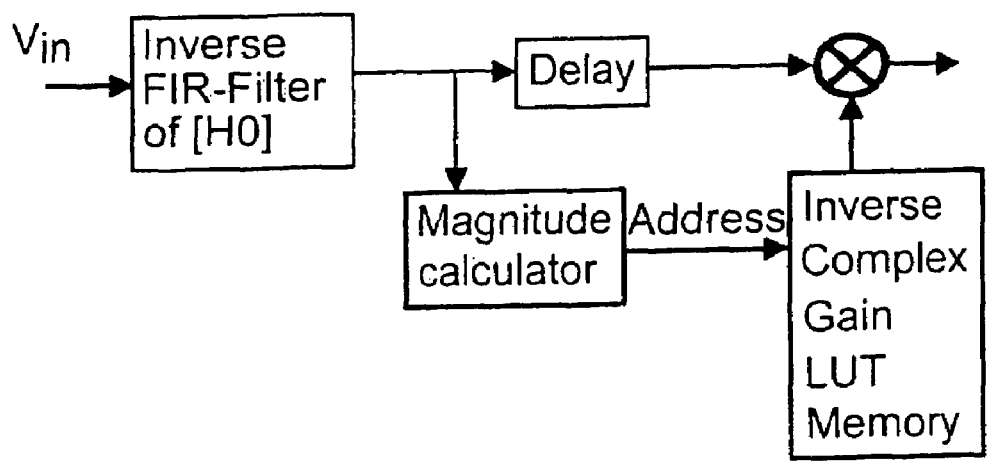
FIG. 5a illustrates the basic complex gain adjustment block of a new digital pre-distorter.
Figure 5B:
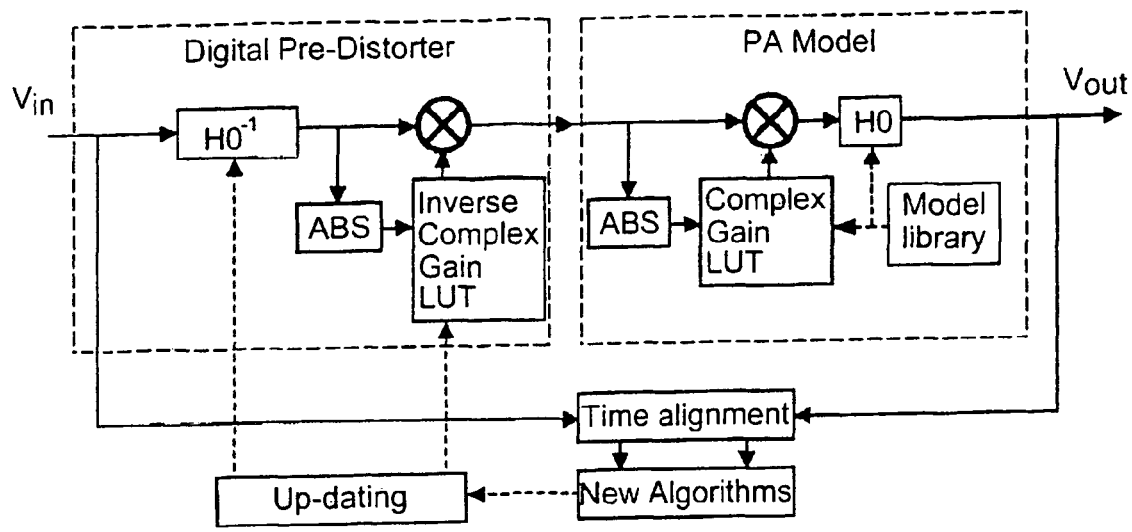
FIG. 5b illustrates that the new digital pre-distorter is an inverse function of the derived digital PA model in FIG 4b.

In such an application as illustrated in FIG. 5a for a simple gain/phase adjustment pre-distorter the difference in the outline from prior art shown in FIG. 1 is the introduced inverse FIR-filter (H0') shown in FIG. 5b. FIG. 5b shows that the digital pre-distorter is an inverse function of the derived digital PA-model in FIG. 4b. THe FIR-filter ($H0^{-1}$) in the pre-distorter is the inverse filter of the earlier mentioned H0 filter describing a device response to an envelope modulation. The pre-distorter gain table LUT has the inverse complex gain of the device. There are differences in the approach in this invention compared to the prior art. By calculation for each iteration the equalized complex gain of the complete pre-distorter and PA and then adapt the inverted complex gain values to the pre-distorter for each adaptation an improved performance of such a simple pre-distorter is achieved. The main difference is the use of the H0 FIR weighing of the data for the complex gain calculation.

FIG. 5b shows the new digital pre-distorter in front of the derived digital device model for gain phase description of an actual device. From the figure is it observed that the pre-distortion circuit is designed as the direct inverse model of the PA digital model according to FIG. 4b. FIG. 5b can be used in a simulation environment. By disabling the inverse filter compensation $H0^{-1}$ the pre-distorter has the same outline as in prior art illustrated in FIG. 1. Contrary to PA-model evaluation, which adjusts the $V_{in}$ signal to resemble the signal $V_{out}$ and where $V_{in}$ is applied to the PA-model input port, the procedure is to do an inverse PA modeling by adjusting the $V_{in}$ signal by the pre-distorter to make the Vout signal to resemble or equal to the $V_{in}$ signal. When calculating the total gain for the combined Pre-distorter and PA-model filter in the DPD calculations, the resulting gain is updated inversely into the pre-distorter LUT. A comparison with the prior art procedures is then available by disabling the H0 PA-model filter in the calculations in the simulation as the $H0^{-1}$ filter and in this way show the performance differences between the new technique and the prior art technique. The disabling of the FIR-filter H0 in the gain calculations is the same as doing direct inverse modeling i.e. no weighting of the LUT table values are done before the calculation. This evaluation is done in a later chapter and the results are shown.

The Time Alignment Algorithm Description

To be able to calculate the gain tables etc for a digital pre-distorter as in FIG. 5b, the calculations are performed on sampled input and output complex I/Q-signal vectors. The signal vectors are loaded into the DSP and the exact time delay between the signals in sample times are calculated by cross correlation of the complex signal vectors or the magnitude of the signal vectors as in prior art descriptions based on modern signal processing methods. For accuracy reasons even further time alignment is done on sub-sample basis in order to extract correct values for up-dating the gain LUT's. This is very important especially for getting prior art pre-distorters to work. Prior art sometimes uses algorithms based on sub samples of the sampling time (T) and adjusts the signals timing to a value t+T/N, where N is an integer value. In this embodiment, only a phase adjustment to one of the signals is utilized.

New Signal Phase Adjustment Method

For correct function of a Pre-distorter the observed signal and the input signal I/Q diagrams must be adjusted and aligned to a better accuracy than the sample time alignment. This indicates that there is a ±180 degree phase adjustment that can be done to the observed signals, when the exact timing in sample times is found. This procedure can be done by use of complex number multiplication correction to each sample of one of the signals. This embodiment only needs a phase alignment on sample basis of the used signals for comparison.

One new approach is to reuse the FIR-filter equalization algorithm by adjusting the complex input and measured signals by doing 1-tap FIR-filter equalization using the input signal as input to the algorithm and the measured signal as result vector in the algorithm. If this 1-Tap filter tap value is A+jB, the time aligned input signal to the DSP can be multiplied by a complex "phasor" calculated as (A+jB)/abs(A+jB) for each time sample of the vector or using the conjugate "phasor" value (A−jB)/abs(A−jB) for multiplying the measured signal depending on the application.

In the same manner as explained in the previous chapter the advantage is, that the error between the signals at the zero frequency will be the least square approximation. The prior art methods must rely on further sub sample optimization of the time difference between the signals. This problem is taken care of in this invention by using the 1-tap FIR-filtering techniques described earlier.

Matrix Algorithm For Calculating LUT Memory

One way of calculating the LUT memory values is by using a matrix for the calculations. The calculations for the prior art LUT is shown as an example.

Values for each sample of the input and measured signals are evaluated for the inverse gain. The magnitude ($R_{in}$) of the input signal is sorted into digital bin-sizes $R_{in}$(Bin). Normally the bin size is $1/127$ or $1/255$ of the maximum allowed input signal amplitude. This corresponds to $(2^7)-1$ and $(2^8)-1$, which is practical when the DSP processor calculates in the base of 2.

The first column of the matrix will contain values of the magnitude of the input signal expressed in bin sizes $R_{in}$[Bin (t)] and contain as many rows as the sampled signal size in time samples.

The second column contains the corresponding time sample magnitude of the observed sampled device signal inverse gain defined as below.

The third column of the matrix will contain the corresponding phase of the observed sampled device signal. This will give a matrix suitable for calculating LUT tables.

The Inverted Complex Gain is calculated in prior art as:

$$Inv\_CG(R(t))=V_{in}(t+\tau_1)/V_{out}(t)$$

for each of the time aligned samples, $\tau_1$ is the number of sample clock time delays used for optimum cross-correlation evaluation. Further time alignment can also used for the signal $V_{in}(t+\tau_1)$ and is normally also performed on sub sample basis.

After that the matrix is sorted for values size of column 1, i.e. the input magnitude expressed as bin values in an increasing order. This means that the rows of the matrix are changed. After that a sub matrix is extracted corresponding to each bin of $R_{in}$ expressed as the input signal magnitude bin value. The average value for the Magnitude and Phase of the corresponding Inv_CG(R(Bin)) is then calculated. For each calculation done the pre-distorter LUT is updated according to $$Mag[Inv\_CG(New)]=Mag[Inv\_CG(Old)+\alpha*(Mag[Inv\_CG(Calc)]^{-1}))$$

$$Phase[Inv\_CG(New)]=Phase[Inv\_CG(Old)]+\beta*(Phase[Inv\_CG(Calc)])$$

Where $\alpha$ and $\beta$ are the pre-distorter adaptation feedback factor values for updating the LUT for each calculation or adaptation. The adaptation feedback factor values is normally in the range 0 to <1. Values greater than 1 may cause "oscillations".

Algorithms for removing the empty Bins, i.e. sub-matrix's containing no values from the calculations, are used and the table values become smoother if the calculation is using some type of smoothing or regression of the final calculated Inverse Complex Gain LUT-result.

The basic problem with pre-distortion is to predict the performance of a non-linear device and compensate for it. This is always done in such a way that the average performance is calculated. Therefore the average values are calculated in the digital signal processor (DSP).

The New LUT Up-Dating Algorithm Description

The digital pre-distortion (DPD) application in FIG. 5a is based on the PA-model. The Pre-distorter is the inverse of the PA-model function, the inverse of the H0 filter is situated before the pre-distorter complex gain block s driven by the pre-distorter LUT-memory content. The usage of the inverse H0-filter is only for frequency dependence and phase correction of the output signal for canceling of the group delay residues on the linearized output signal from the pre-distorted device. This is not possible with the mentioned prior art patents. If group delay compensation is utilized the filter gives the opposite phase delay compared to the PA-model H0 calculated filter. The inverse H0-filter is also used in further extensions of the new invented pre-distorter blocks described later in this invention disclosure. In a simple DPD application as in FIG. 1, the PA-model H0 is only used virtually in the DSP calculations for achieving a correct convergence of the pre-distorted LUT-memory.

The change in the algorithms will be explained below. In calculating the DPD gain table LUT, the convolution of the signal $S_{in}$ with the calculated H0 filter is used by solving $S_{in}(x)H0=V_{out}$. The filter magnitude gain of H0 at zero frequency is adjusted to equal 1. The resulting signal from the convolution of Error ! Objects cannot be created from editing field codes, and the gain normalized H0 is named $S_{in}H0$. After that this signal is time adjusted again with the measured PA-signal due to the introduced FIR-filter digital delay in samples of sampling time (T).

The magnitude of that signal ($S_{in}H0$) is sorted into magnitude bins $R_{in}[Bin(t)]$ and the complex gain expression for the PA and the pre-distorter is calculated. An error vector EV is calculated as $EV=V_{out}S_{in}H0$ for each sample $V_{out}$ is the measured performance of the combined digital pre-distorter, up-converter, PA and down-converter in FIG. 1. As mentioned before the down-converter and ADC must be very accurate in a real design.

The modification and derivation of the gain expression is done as below for each sample of time: (Remember that the DC-gain of $S_{in}H0$ is the same as for $S_{in}$).

$$V_{out}(t)=S_{in}H0(t)+EV(t)$$

The complex gain expression can be written as a vector $$V_{out}/S_{in}H0=1+EV/S_{in}H0,$$

where the rows is corresponding to the sampling time t.

Arranging this expression for ease in DSP-implementation gives the Complex Gain expressed as below by multiplying both the nominator and the denominator with the conjugate of the input signal (remembering that a complex vector multiplied by its conjugate value is the magnitude squared): For each time sample of the signals the following expression is evaluated:

$$CG=1+[EV*S_{in}H0(conjugate)]/[mag(S_{in}H0)]^2$$

where $mag(S_{in}H0)=R_{in}$. As $R_{in}(t)$ squared is the input signal power the complex gain can also be made as dependent on the input signal power. But in this invention the input signal magnitude is used and shown.

The result from the evaluation is put into a row of a matrix having one row for each sample time instant of the signals. A matrix row will contain the following column contents.

$R_{in}[Bin(t)]$, mag[CG(t)] and phase[CG(t)] and contain as many rows as the total number of samples used in the DSP from the $S_{in}$ and $V_{out}$ signals after time adjustments and FIR-filtering.

The same matrix algorithm calculations for solving the earlier described inverse complex gain LUT's of prior art is used. Update of the combined [DPD and PA gain], giving the accumulated and adopted Complex Gain Table virtually present in the DSP as a function of the input signal magnitude values in Bins is done. Then the updated PA_DPD magnitude gain table is inverted by 1/X division The PA Phase Gain table is multiplied by a factor−1. The new inverted table values are inserted as new values in the Pre-distorter LUT, will thus be the inverted complex gain.

$$LUT\ content:\ Inv\_CG(Bin)=1/CG(Bin)$$

The adaptation is done in the following way. When the pre-distorter is initiated the virtual PA-gain table situated in the DSP is filled by complex values according to a Magnitude gain of "1" and a Phase gain of "0" and the pre-distorter will have the same values as start in the LUT. The reverse H0 filter is filled by zeros for all tap-values except the middle tap, which is loaded by a unity value. For this simulation when comparison to prior art the pre-distorter inverse H0-FIR-filter is not updated. This means that this inverse H0 FIR-filter is disabled in FIG. 5b. But the H0 filter method is used in the DSP calculations for achieving the improved performances of this new invention.

Each DSP calculation gives a new correction (adaptation) added to the PA-model complex gain table virtually situated in the DSP according to:

MAG(GC(bin))=Mag/GC(bin)_old+α*[(Mag(GC(bin)_calculated]$^{-1}$)

Phase (GC(bin))=Phase(GC(bin))_old+α*(Phase(GC(bin)_calculated)

Then the Virtual table is read and the Inverse Complex Gain is calculated and loaded into the Digital Pre-Distorter LUT memory according to the adaptation procedures as before.

The new way of calculating the complex gain table and the algorithms used gives possibilities to improve the prior art Memory-less DPD application into a DPD-system, that covers memory effects emerging from time and phase delays in the actual real non-linear device due to the FIR-filter equalization algorithm method used for weighting the frequency response of the data for the LUT calculations.

Higher values of α and β pre-distorter adaptation feedback factors can be used and still a good convergence can be achieved with this new DPD application. This allows for faster convergence of the pre-distorter.

Performance Evaluation of the New Gain/Phase Pre-Distortion Applied in a DPD Solution Verification of the new algorithms described in this invention is done by simulation. The aim has been to compare the basic prior art direct inverse gain calculation algorithms according to a FIG. 1 block, with the algorithms applied for the new digital pre-distorter according to FIG. 5, applied to an amplifier, that does not behave as in an "ideal" amplifier without time and phase delays in the envelope modulation response.

A basic simulation of digital pre-distortion performance was done. For the simulation the Digital Power Amplifier model according to FIG. 4b, derived from the PA-model work, was used as the active device in the simulation. The Base-Band digital PA-model used was derived from measurements. The model was implemented with FIR-filters for achieving a model with memory effects emerging from time delays and frequency response from envelope modulations.

Simulation Results

Figure 6A:
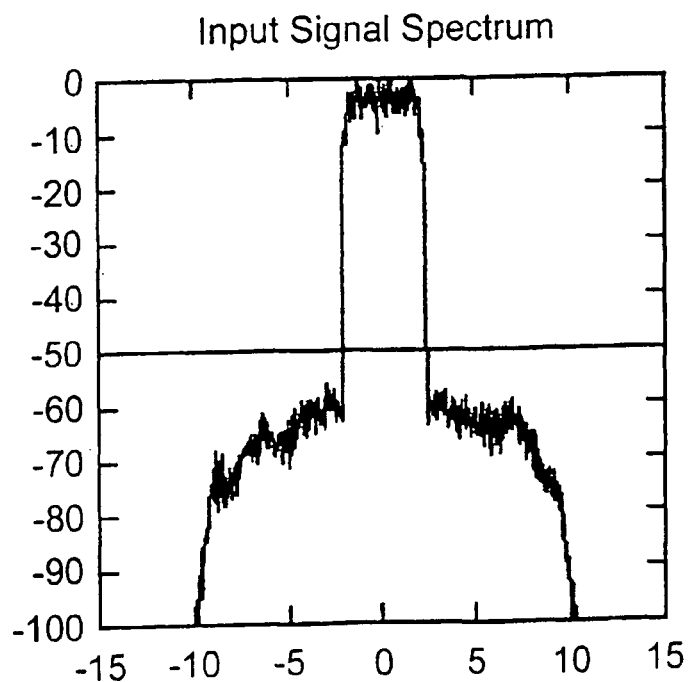
FIG. 6a illustrates a measured input signal spectrum for spectrum performance of the derived PA-model.
Figure 6B:
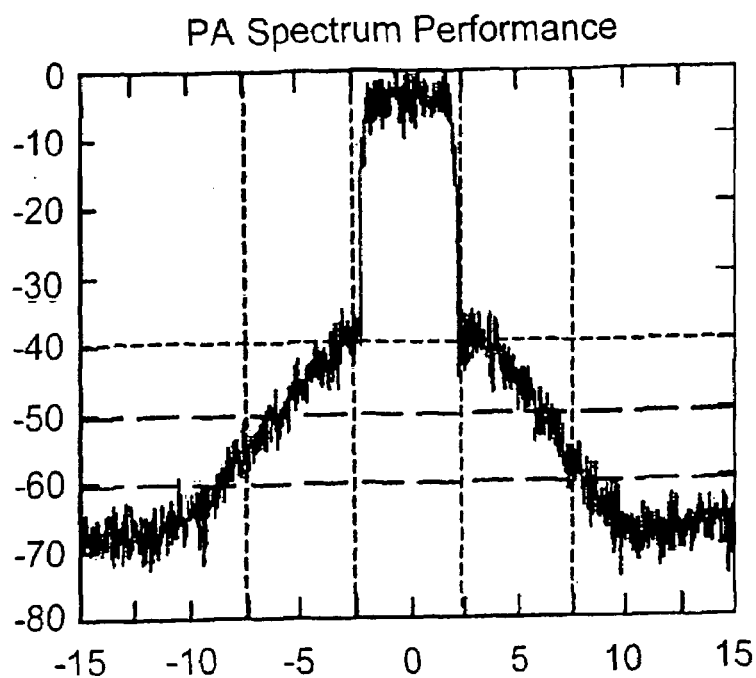
FIG. 6b illustrates the spectrum performance of the derived PA-model with no pre-distortion applied.

FIG. 6b shows the spectrum performance of the derived PA-model with no pre-distortion applied and using the input signal shown in FIG. 6a. The signals have been filtered to approximately 30 kHz resolution bandwidth in the spectrum display. The amplifier has due to the memory effects asymmetrical distortion spectrum.

Figure 6C:
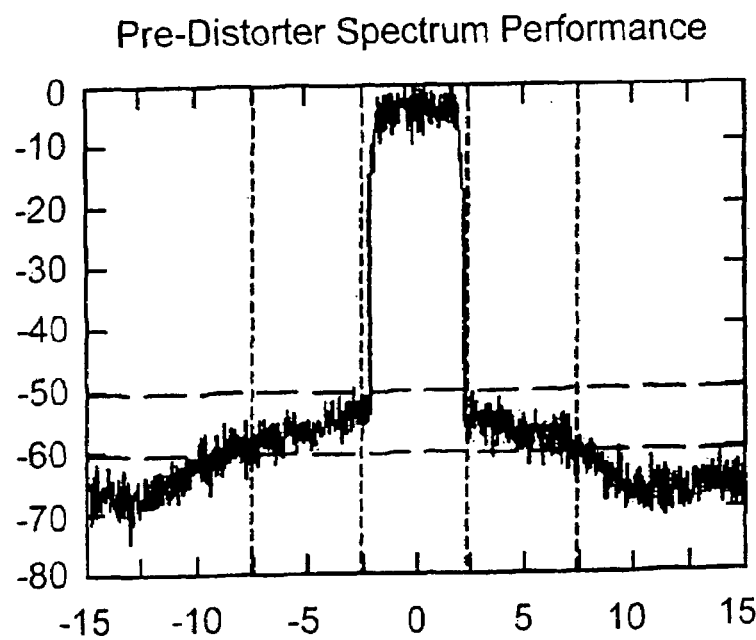
FIG. 6c illustrates the spectrum performance of a prior art direct inverse gain pre-distorter achieved after 5 adaptations of the LUT.

FIG. 6c shows the spectrum performance after five updates of the LUT by using settings according to the prior art direct inverse gain calculations.

Figure 6D:
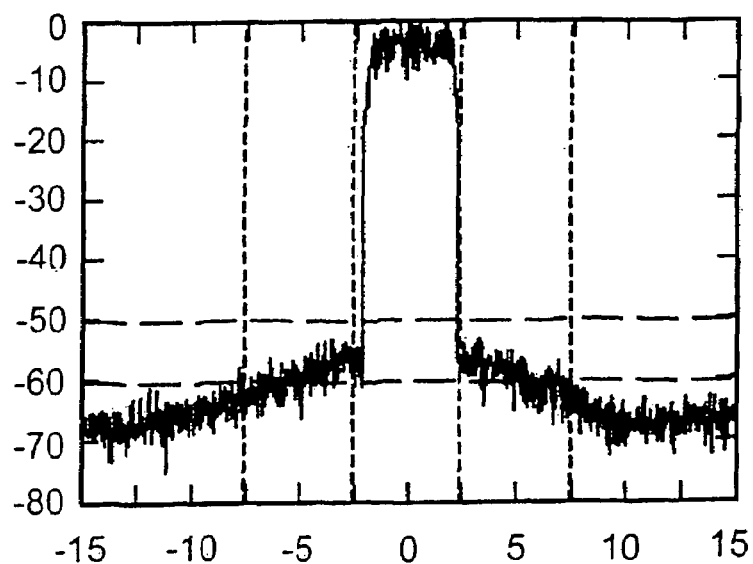
FIG. 6d illustrates an improved spectrum performance of a pre-distorter according to an embodiment of the present disclosure also after 5 adaptations of the LUT.

FIG. 6d gives the improved spectrum performance also after five updates of the LUT based on the new pre-distorter according to an embodiment when the FIR-filter weighting algorithm was used for the gain calculations. For both the prior art and the new method improvement after five updates was not noticeable.

Figure 7A:
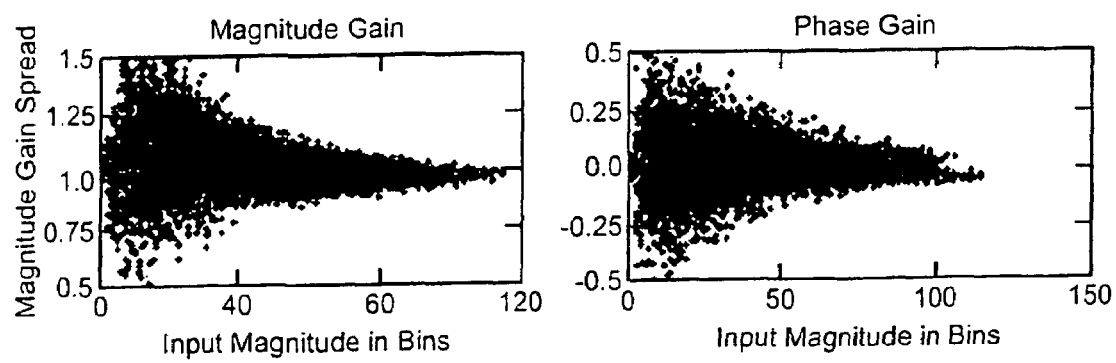
FIG. 7a illustrates magnitude gain data base and inverted phase gain data base for first adaptation of prior art direct inverse gain calculation DPD solutions.

FIG. 7a illustrates the magnitude and phase of the inverse gain used for achieving the average calculation for prior art pre-distorters for the initial first adaptation calculation of this type of pre-distorter.

Figure 7B:
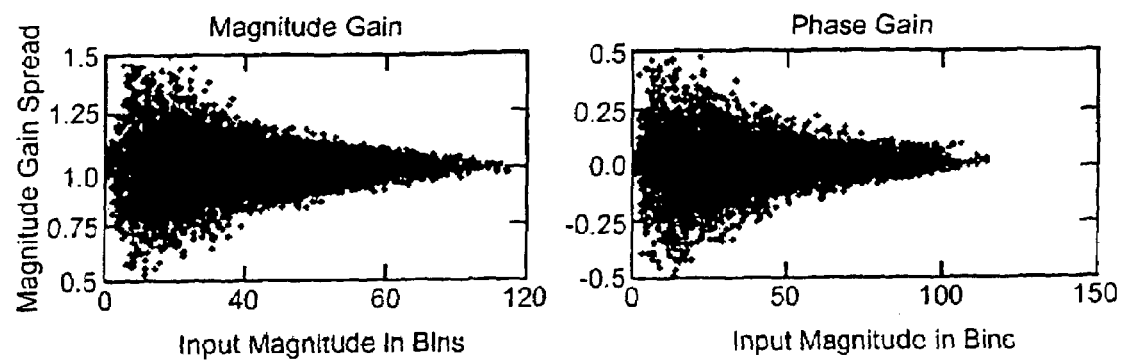
FIG. 7b illustrates magnitude gain data base and inverted phase gain data base for fifth adaptation of prior art direct inverse gain calculation DPD solutions.

FIG. 7b shows the same data after the fifth adaptation according to prior art. Only a minor tendency, of the database area shrinking during adaptation, is observed.

Figure 7C:
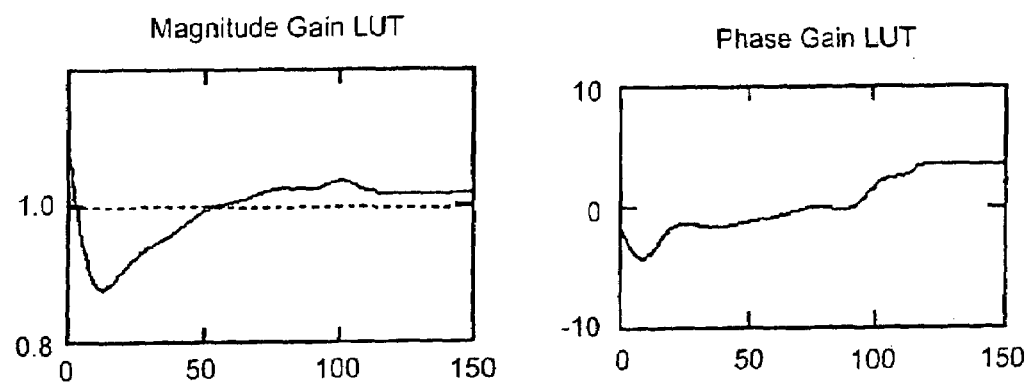
FIG. 7c illustrates the content of the LUT table for magnitude gain and phase gain after 5 adaptations of prior art direct inverse gain calculation DPD solutions.

Further, FIG. 7c shows the content of the LUT table after five adaptations in prior art. The LUT table still contains a lot of ripple in the prior art procedures and this is the explanation for all the peculiar mathematical algorithms patented for prior art applications in order to reduce the LUT value ripples normally blamed on noisy input data's.

Figure 8A:
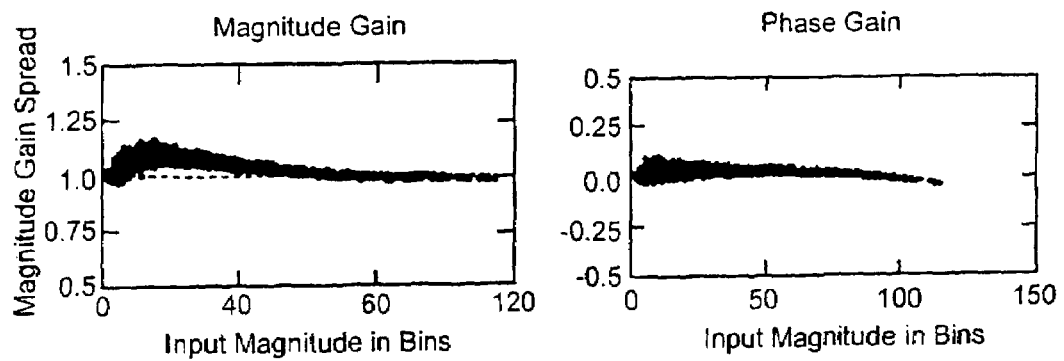
FIG. 8a illustrates the same Magnitude and Phase gain data's plotted in the same scale as in FIG. 7a for the first adaptation for calculating the PA-model+DPD performance, according to an embodiment, using the FIR-equalization algorithm described earlier in this invention in the digital signal processor.

FIG. 8a shows the same Magnitude and Phase gain data's plotted in the same scale as in FIG. 7 for the first adaptation for calculating the PA-model+DPD performance using the FIR-equalization algorithm described earlier in the digital signal processor.

Figure 8B:
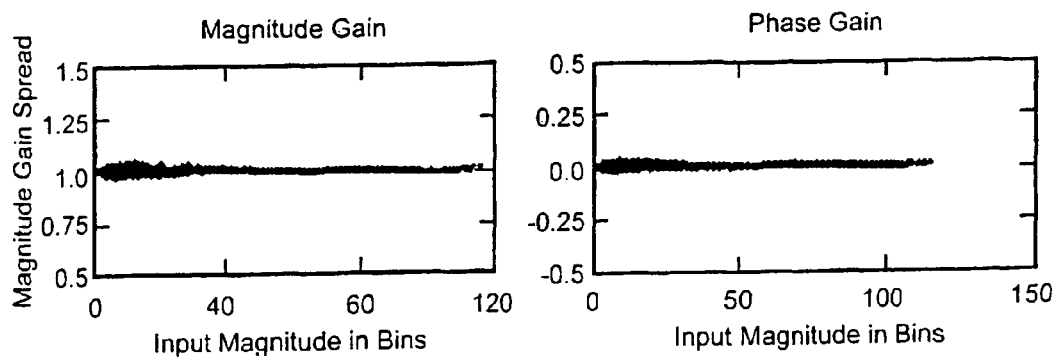
FIG. 8b illustrates the same data's after the fifth adaptation according to the embodiment indicating a remarkable reduction of the data area for gain calculations and adaptation is seen.

FIG. 8b shows the same data's after five adaptations for this invention. A remarkable reduction of the data area for gain calculations and adaptation is seen.

Figure 8C:
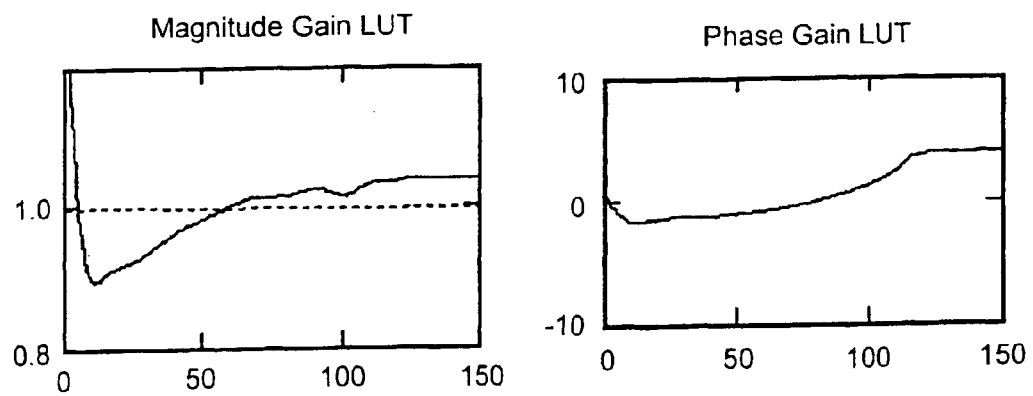
FIG. 8c illustrates an inverted amplitude and phase gain table contents put into the pre-distorter LUT after the fifth adaptation according to an embodiment of the present disclosure.

FIG. 8c shows the inverted gain table contents put into the pre-distorter LUT after five adaptations.

FIGS. 6, 7 and 8 illustrate the enhanced performance of applying the algorithms disclosed above to a simple DPD outline. The equalization FIR-filter algorithm solves many problems like noise suppression and helps to reduce the data spread for calculating the average values used in a pre-distorter look-up table memory. No noise was added to the basic simulations shown.

The results are in accordance with the fourth embodiment if this invention. The basic conclusion from the simulation was that the prior art pre-distorters based on direct inverse gain calculations, are not able to converge to an optimized solution. Prior art solutions are not able to achieve equal side-band levels of the distortion on a real PA with time delay in the actual response as no consideration of the frequency response of the actual device can be made. Prior art patents mentioned in this disclosure tries to improve the basic problem of direct inverse gain calculations by implementing own invented additions and approximations to the basic DPD outline based on FIG. 1.

It will be shown later in this disclosure that the application of the inverse H0.sup.-1 filter in the "Gan/Phase" pre-distortion block, that minimizes the group delay differences between the input signal and the device output signal, will give possibilities to investigate the cause and adjust more of the remaining distortions that a complex gain table LUT DPD function block not can handle.

The PA-Model With Added Functional Dependence Block Description

The derived PA-model shown in FIG. 4b can be improved to handle more than the first and the partly second type of distortion. This is possible because the new model method reduces the error vector between the model and the device measured so more detailed performance differences between the model and the actual device is revealed after each step. This is not possible when only a distortion reduction is achieved without error vector minimizing as in prior art. The functionality enhancement is done by cascade connections of further digital PA-model functions blocks.

Figure 9:
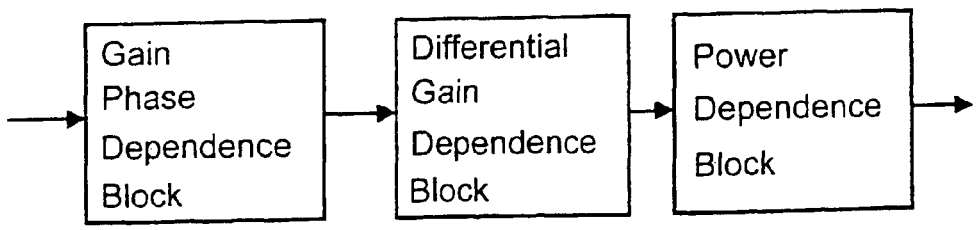
FIG. 9 illustrates the new proposed digital model function blocks for further reduction of the error vector between the digital PA-model and the PA-measured performance.

FIG. 9 shows the new proposed digital model function blocks for further reduction of the error vector between the digital PA-model and the PA-measured performance. The figure shows the already described "Gain/Phase dependence block" followed by the "Differential Dependence Block" and the "Power Dependence block". The approach is to compensate for any systematic remaining errors and having in mind that the function blocks are related to the real device physical cause of the systematic errors. The function blocks in the digital model in this embodiment have the availability to be individually optimized for the model performance in a consecutive and adaptive way.

The Differential Complex Gain Dependence Block

Looking at FIG. 4a there is a time constant (.tau.) shown in the power amplifier symbol representing the intrinsic device turn on delay for input signal change which is believed to be much smaller than the sampling time used in the pre-distorter or the measurement sampling clock time. The influence from this behavior is described by looking at the first time derivative of the PA-modeled signal and the measured signal. One basic idea is to reuse the algorithms from the first block and design a "Differential Complex Gain" table depending on the derivative versus time of the input signal and calculate a differential gain influence in the function block referred to as the "Differential Complex Gain" dependence block (—dCG).

The Differential Complex Gain Dependence Block Derivation

The mathematics for the "Differential Complex Gain" block design is presented below. The modeled signal after the "Gain/Phase Gain" block gives the averaged performance characterization of the first gain block in the PA-model and is here named as $V_{avg}(t)$. The measured signal is named as $V_{out}(t)$. Those signals can be written also as a function of the first derivative versus time (samples of sampling time T).

$$V_{out}(t+T)=V_{out}(t)+dV_{out}(t+T) \quad (1)$$

where $dV_{out}(t+T)=V_{out}(t+T)-V_{out}(t)$ and all are complex numbers $$V_{avg}(t+T)=V_{avg}(t)+dV_{avg}(t+T) \quad (2)$$

A goal is for the digital PA-model to have as small errors as possible. Therefore, it is preferred that the above equations are such that $V_{out}(t+T)$ equals $V_{avg}(t+T)$. Putting this into the above equations and solving for $dV_{out}(t+`1`)$ gives:

$$dV_{out}(t+T)=dV_{avg}(t+T)-.[V_{out}(t)-V_{avg}(t)] \quad (3)$$

A new average model error vector $EV_{avg}$ after the gain and phase block is identified and defined as:

$$EV_{avg}(t)=.[V_{out}(t)-V_{avg}(t)] \quad (4)$$

Solving for the differential complex gain expression defined as:

$$dCG(t+T)=dV_{out}(t+T)/dV_{avg}(t+T)$$

gives:

$$dCG(t+T)=-1-EV_{avg}(t)/dV_{avg}(t+T) \quad (5)$$

From equation (4) it is also realized that the $EV_{avg}(t)$ has a corresponding $V_{avg}(t)$ value and also a magnitude R of $V_{avg}(t)$ input signal to this block associated. Therefore the differential complex gain $dCG(t+T)$ values has a dependence of the preceding sample input signal magnitude.$(R(t))$. A similar digital function block as for the first gain block in the digital PA-model can be designed. It is also possible to design a function block depending on the $dV_{avg}(t+T)$.

The output signal after this block is modified in the following way:

$$VdG(t+T)=V_{avg}(t)+dV_{avg}(t+T)*dCG[RBin(t)] \quad (6)$$

Where dCG(Rbin) is the differential complex gain value calculated from equation (5) in the same manner as described for the first "Gain and Phase Gain" dependence block and put into a differential complex gain LUT memory. Adaptations of the differential complex gain block LUT can be done as in the previous block and a performance measure can be evaluated by comparing the maximum adaptation value to a present limit.

Figure 10:
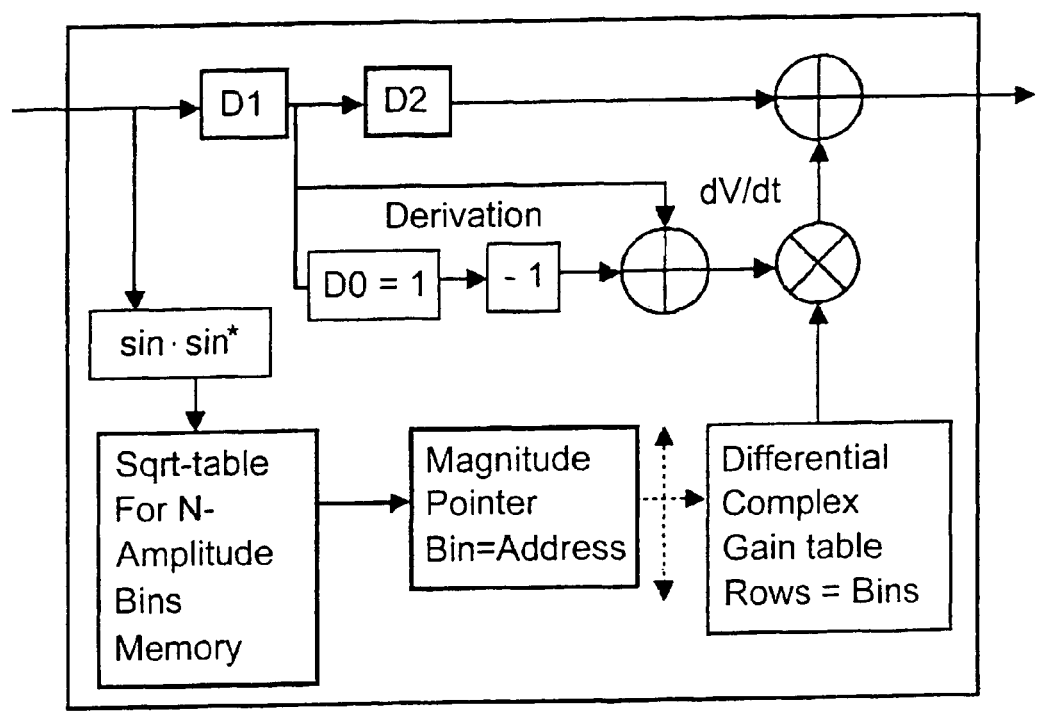
FIG. 10 illustrates a digital model differential complex gain dependence function block.

FIG. 10 shows the "Differential Complex Gain" dependence block digital functionality, where the delays (D0, D1, D2) in sample times T are accordingly designed for time alignment within the function block to satisfy equation (6). The same gain matrix calculation routines can be applied to this block as the previous Gain/Phase block to calculate a differential gain LUT depending on the input signal amplitude (R) to the block.

Figure 11A:
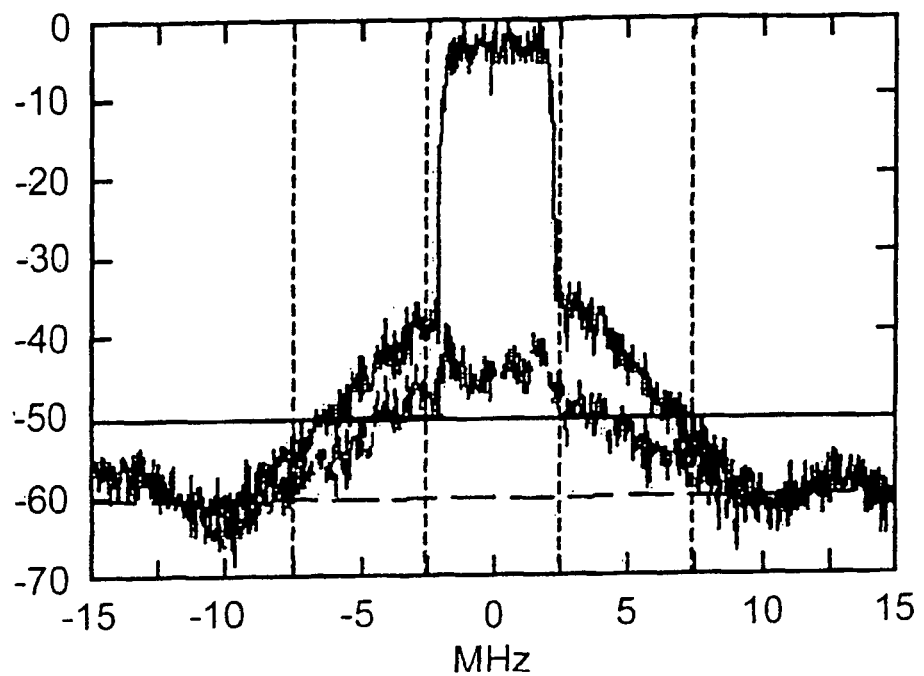
FIG. 11a illustrates the achieved results from consecutive optimizations of the first PA-model "Gain/Phase" dependence block.

FIG. 11a shows the achieved results from consecutive optimizations of the first PA-model "Gain/Phase" dependence block.

Figure 11B:
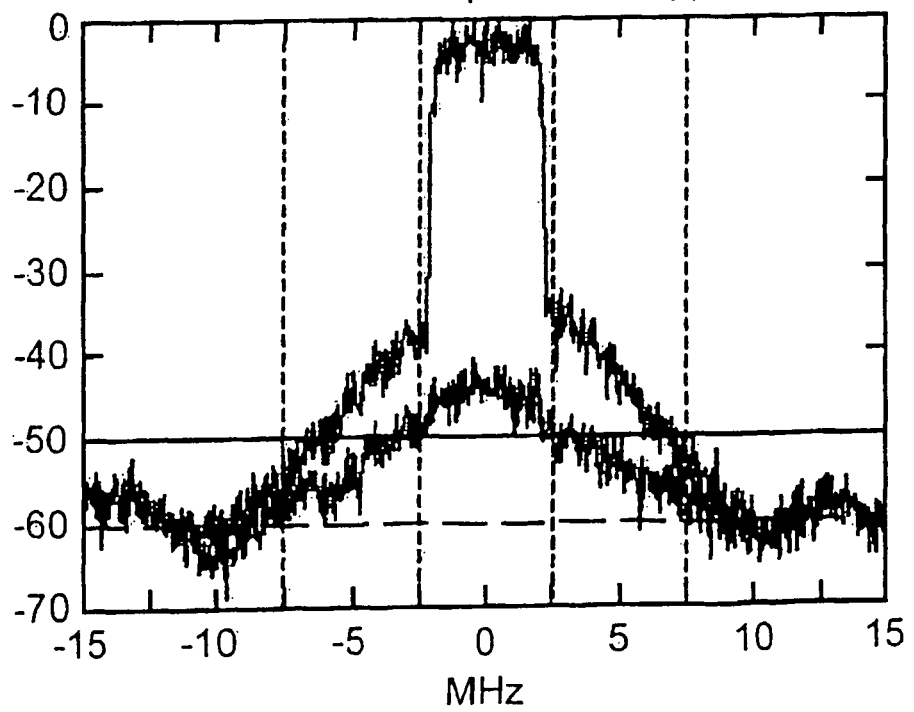
FIG. 11b illustrates the same result when the "Differential Gain" dependence block is added to the digital device model.

FIG. 11b then shows the same result when the "Differential Gain" dependence block is added to the digital device mode. Both graphs in FIGS. 11a and 11b show the measured PA-output spectrum and the error vector spectrums between the Device and the modeled performance.

Figure 11C:
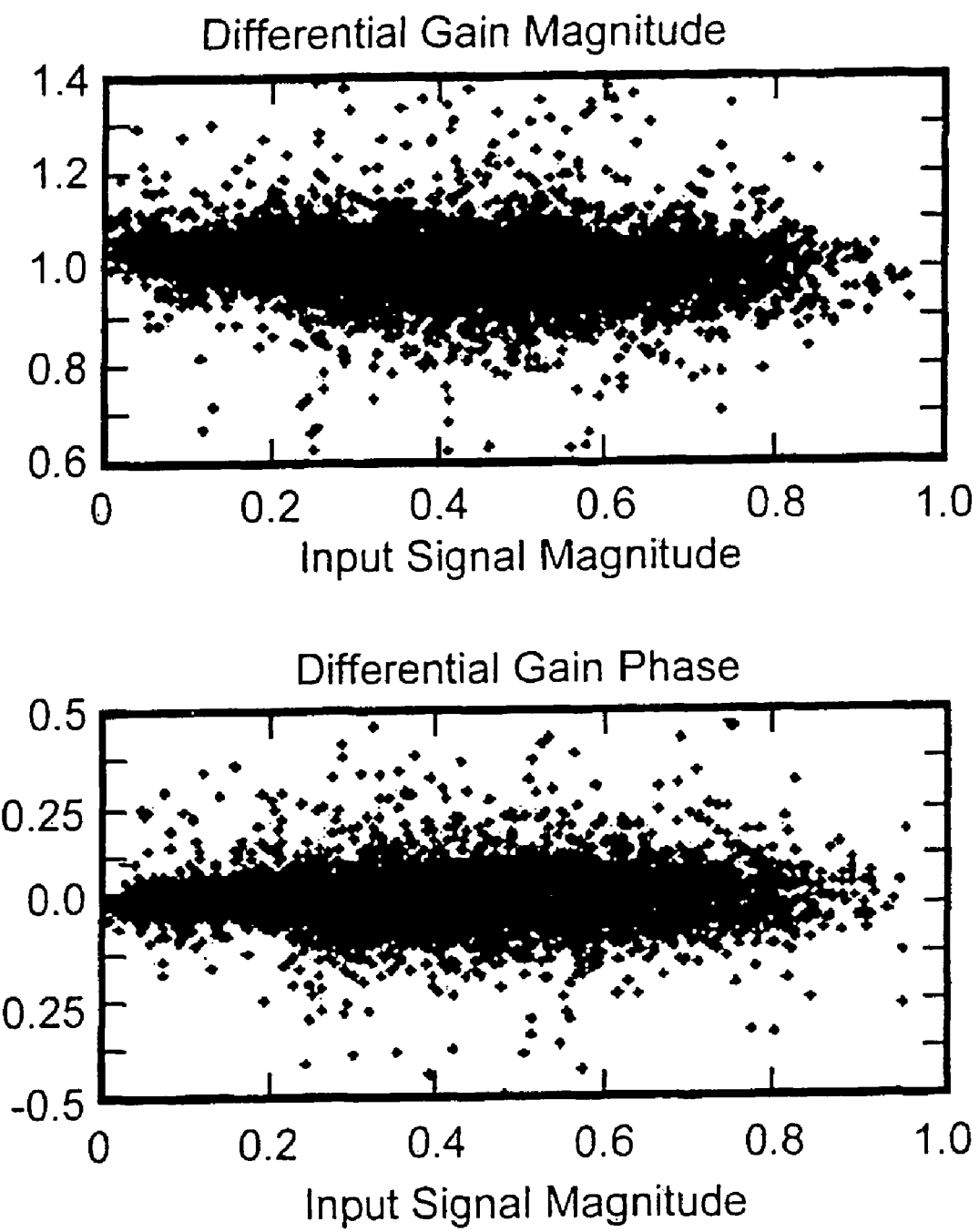
FIG. 11c illustrates the differential gain magnitude and the differential gain phase in radians versus input signal magnitude.

FIG. 11c shows the database for calculation and optimization of the differential gain LUT table dCG(Rbin) for the device.

The result from the modeling shows that the differential gain modeling takes care of the fine gain/phase errors within the signal bandwidth and further reduces the error spectrum between the model and the measured device.

The Power Dependence Block

The PA-model derived so far still has residues of distortion left. An investigation of the remaining error vector shows magnitude errors but essentially very low phase shifts. The magnitude errors are considered to be the influence associated by the input power to the PA. To investigate this, the remaining signal amplitude errors between the measured PA magnitude ($R_{out\_}$Measured) and the PA-model (R_Model) are evaluated for further investigations.

$R_{err}(t)=R_{out\_}$Measured$(t)-R$_Model$(t)$, the magnitude error vector versus time.

Plotting the vector $R_{err}$ versus sampling time "t" and [R_Model(t)]$^2$, which is the Power P(t) in the modeled PA-signal, shows that there are some memory effects emerging from the input signal power to the PA still left to be modeled.

The approach and thinking in this disclosure is different from prior art methods. The basic idea is by looking of what have so far been done in the PA-modeling function blocks. THe "average" PA-model performance is derived from an input signal. This input signal also has an average power versus time. Therefore the performance for power dependence built into the model should then depend on the power levels where the average power corresponds to the average power of the input signal. A model that most correctly describes the Power dependence of the real Power Amplifier should then be based on the "difference from the average power of the signal used for the modeling work".

The average power of the input signal to this power block is calculated and denoted PM. A new difference power vector is designed as:

$$dP(t)=P(t)-PM$$

Figure 12:
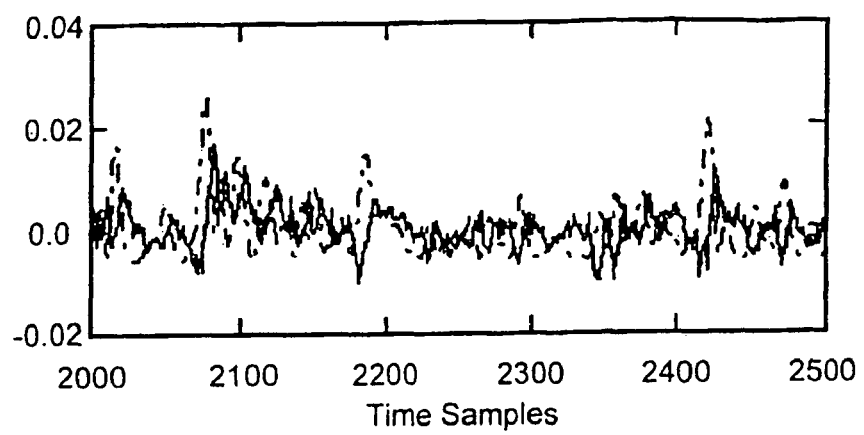
FIG. 12 illustrates a plot of the input signal differential power and the Model Magnitude errors versus the measured power amplifier.

FIG. 12 shows the differential power dP(t) (dashed curve) plotted together with the remaining amplitude errors $R_{err}(t)$ (solid curve) between the digital model and the actual PA-measurement in order to get a view of how the dependence looks like. From the figure a conclusion is drawn that there is some correlation a few samples after the dP(t) plot versus the $R_{err}(t)$.

To have closer look at the dependence of the differential power dP(t) versus the remaining magnitude errors $R_{err}(t)$, a cross-correlation evaluation common in signal processing theory is done.

Figure 13A:
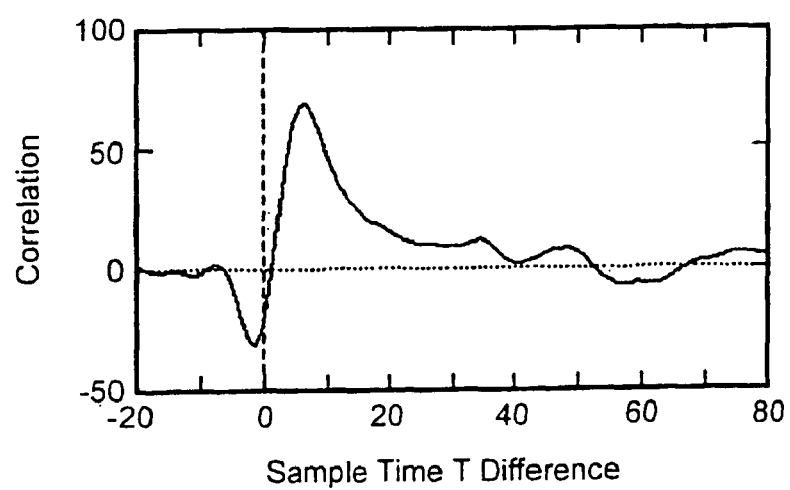
FIG. 13a illustrates differential input power cross correlation versus the magnitude errors of the model and the actual device.

FIG. 13a shows the cross-correlation result plotted as a function of different sample time differences in time samples (I) between the signals used.

Looking at FIG. 13a, conclusion can be drawn that the cross-correlation result basically shows the combined impulse response from combined low pass filters with different time constants, gain and bandwidth. In a PA-model power compensation block function aiming to achieve low distortion side-bands, the highest response that also have the most bandwidth (short impulse response) is considered to the best job of suppressing the distortion outside the carrier from the power influence. The correction solution for the next block is then to add a filtered differential power influence correction to the magnitude of the so far modeled signal. The "Power Filter" may be designed with symmetrical taps from the cross-correlation evaluation as having the cross correlation values from the zero cross correlation timing up to the maximum value defining the center FIR-filter tap of the impulse response. When half of the impulse response is chosen the rest of the response is achieved by mirroring the tap values from the center to the end of the FIR-filter. The number of tap is then set to be an odd number and the FIR-filter is symmetrical around the center tap. This reduces the numerical calculations in the power correction block to be defined.

Another simpler approach implemented in the simulation is to design the filter as a standard signal processing window-function filter. The cross-correlation is evaluated in time response from the first positive going zero-crossing to the max value as above. The number of taps is decided as 2 times+1 of the time difference in samples. A "Hanning" window function is used for the differential Power FIR-filter in this invention description. Other common window function filters or low pass FIR-filters can also be used. A filter function with more taps and unsymmetrical tap values more resembling the cross-correlation evaluation results can also be used, but this will mean a filter containing more taps and introducing more processing efforts.

For evaluation of all the parameters to be designed into this power correction block, a convolution of the differential power vector dP(t) with the chosen differential Power FIR-filter is used to achieve a differential moving average power vector as the new result named $dP_{ma}(t)$. This new vector is then again cross-correlated versus the $R_{err}(t)$ vector to define the optimum time delay td in time samples for doing the power influence correction in the model. The power FIR-filter gain factor GP for optimum compensation gain is calculated by reusing the 1-tap FIR equalizing DSP-routine, used before in this invention description, once more on the signals resulting in $dP_{ma}(t+td)*GP$ equal to $R_{err}(t)$ in the least square optimization manner. The achieve factor value GP is the optimum moving average difference power correlation to the magnitude error $R_{err}(t)$ signal. The power correction to the digital model signal is done as $$S_{in}\_Model\_Power\_Correct(t) = S_{in}\_Model(t) * [1 - GP * dP_{ma}(t+td)/(R_{in}(t)+\delta)]$$

where δ is a small number for preventing overflow in the calculations.

In the expression the investigated power dependence of the magnitude error is converted to a gain expression affecting the magnitude of the signal to describe the power dependence. This is possible as the previous block evaluations result in an error mainly in magnitude but not in phase between the signals.

Figure 13B:
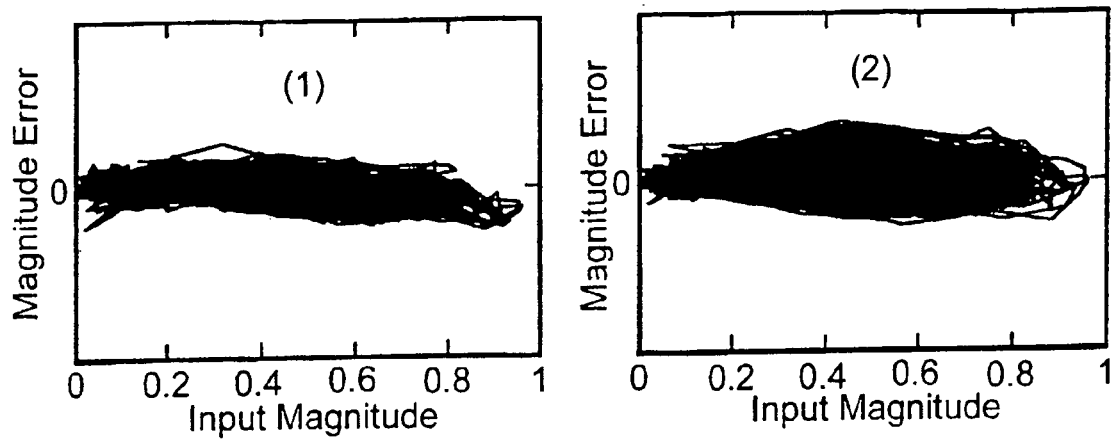
FIG 13b illustrates corrected magnitude errors and the original magnitude errors between the model and the measured device.

FIG. 13b shows the power corrected magnitude error vector (1) and the magnitude error vector without power correction compared to the device measured signal (2) plotted versus the input signal magnitude $R_{in}$ to the power dependence block compared with the device measured signal.

Figure 14:
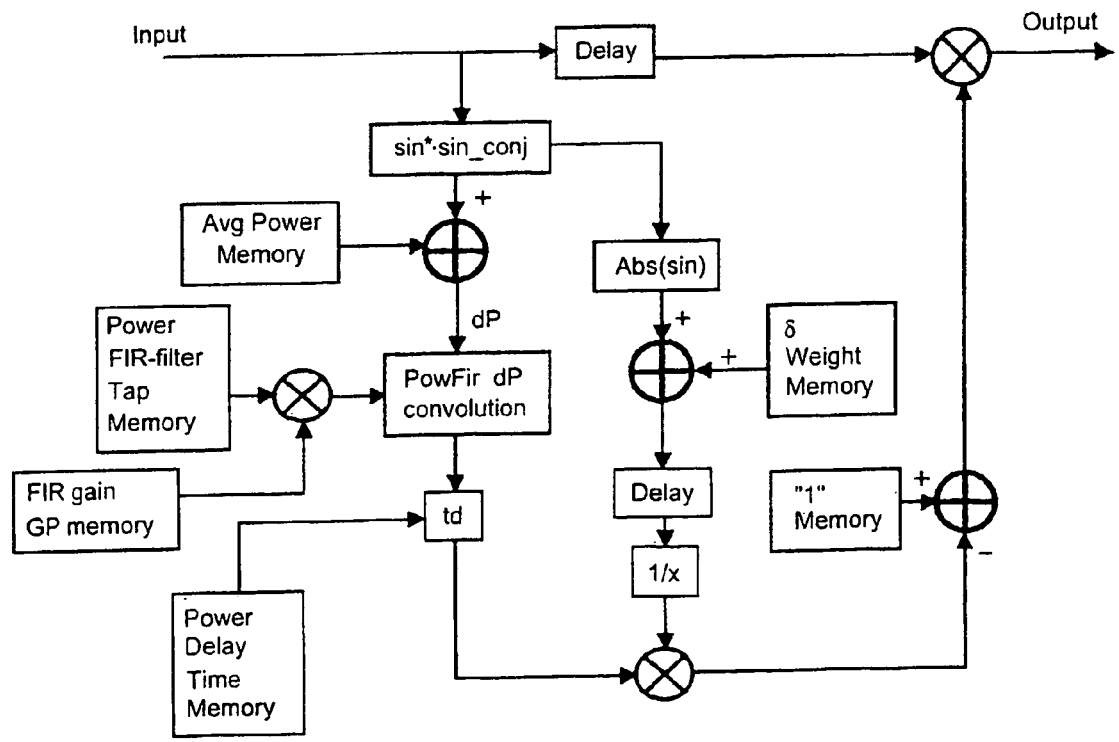
FIG. 14 illustrates the Digital Model with power dependence function block.

FIG. 14 shows the derived power dependence block digital outline. The shown time delays are adjusted according to the digital implementation so the expression $S_{in}\_Model\_Power\_Correct(t)$ is satisfied.

The blocks so far achieved in the digital model was shown in FIG. 9. Further refinement of the model is available at the choice of the user. This model works very well as each individual function has the availability to optimize the performance for each individual characteristic of a real device as long as the characteristic is based on some physical dependence that can be described.

As the error between the digital base-band model and the measured PA performance is reduce for each implementation of a function block there are also possibilities to apply the methods described above to achieve even further reduction of the model errors. Devices showing errors depending on the input signal magnitude can be evaluated in the same way as for power dependence by providing differential magnitude correlation versus the remaining errors between the model and the measured device as an example.

Figure 15A:
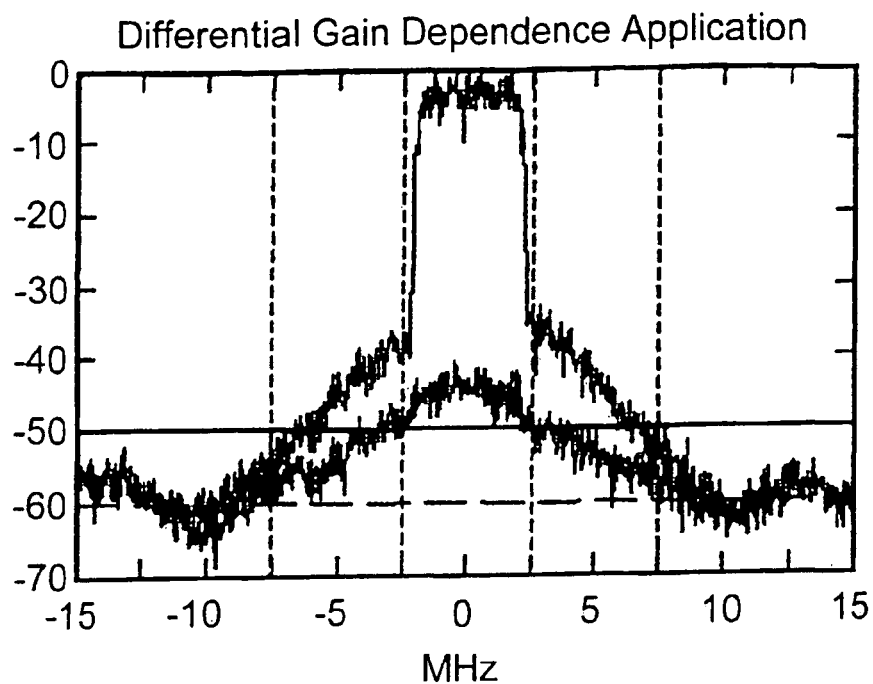
FIG. 15a illustrates a comparison of the digital model spectrum errors versus the actual device with differential gain compensation added to the basic gain/phase dependence block.
Figure 15B:
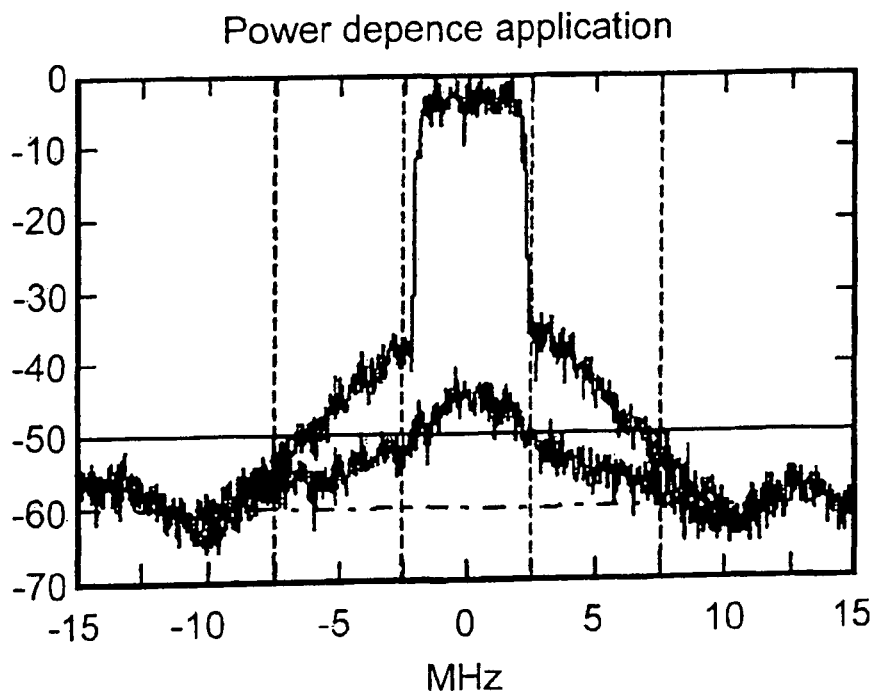
FIG. 15b shows a comparison of the digital model spectrum errors versus the actual device with further addition of the power dependence function block correction.

FIG. 15 shows the achieved spectrum improvement of the Error Vector between the modeled performance compared to the measured PA-performance. THe enhancement in the digital model with differential power pre-distortion correction applied versus the no power-corrected model is shown FIG. 15a shows comparison of the digital model spectrum errors versus the actual device with dependence correction the results model results after differential complex gain dependence model from FIG. 11 is repeated In FIG. 15b the results after the Power dependence model corrections are shown. Both figures show the spectrum performance of the measured PA-device and the corresponding error vector spectrum versus the digitally modeled device.

The resulting error vectors are normally regarded to be the result how good a pre-distortion can be applied and how it works on the actual device. The achieved error vector for the power corrected model shall be compared to the used input signal spectrum shown in FIG. 11a for a simple AM to AM and AM to PM digital model.

By comparing FIG. 15 to previous figures of spectrum and error plots of the derived digital model the conclusion is that each block contributes to the accuracy of the model as expected when it is based on physical dependence of a device.

FIG. 15 shows how far the modeling work can be performed on relative poor measurement equipment based on 12-bit ADC and DAC built in to the commercial equipment. This PA-model can also be used for simulation purposes in a pre-distorter environment for optimizing the pre-distorter system performance and implementation. For instance no considerations to the introduced errors in the sampling clock synchronization between the commercial instruments are done. The noise from the down-converter and the local oscillator present in the test equipment is also present in the model calculations presented in this disclosure.

Improved Modeling of the Digial PA Model

Looking at FIG. 13b there is seen a curvature in the power corrected magnitude error that is remaining. The errors do not follow the center zero line on y-axis. This indicates that there is some gain errors remaining in the model so far done. To include this in the digital model a rearrangement of the model blocks shown in FIG. 9 is done. The power correction is done prior to the Complex gain/phase block. This indicates that the gain LUT reading in this block will be corrected for the power influence before the signal magnitude is selected as address in the gain LUT. The correction is done with the same formulas as for post correction described before. With this method multidimensional LUT memory is not needed.

Figure 16A:
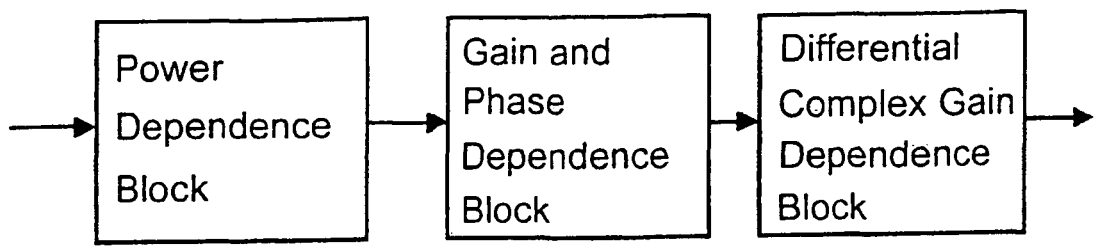
FIG. 16a illustrates the enhanced digital model function blocks.

FIG. 16a shows the rearrangement of the digital device model blocks with the power correction dependence block used as the first block in the Digital Device Model blocks. By evaluation a device calculating a model the Power correction block is first disabled and the two following blocks are evaluated for best agreement of the model. Then the power dependence block data base needed is evaluated and the data is loaded with the same values as for the post correction to the pre-correction block and the gain/phase block and the differential complex gain block is evaluated again.

Figure 16B:
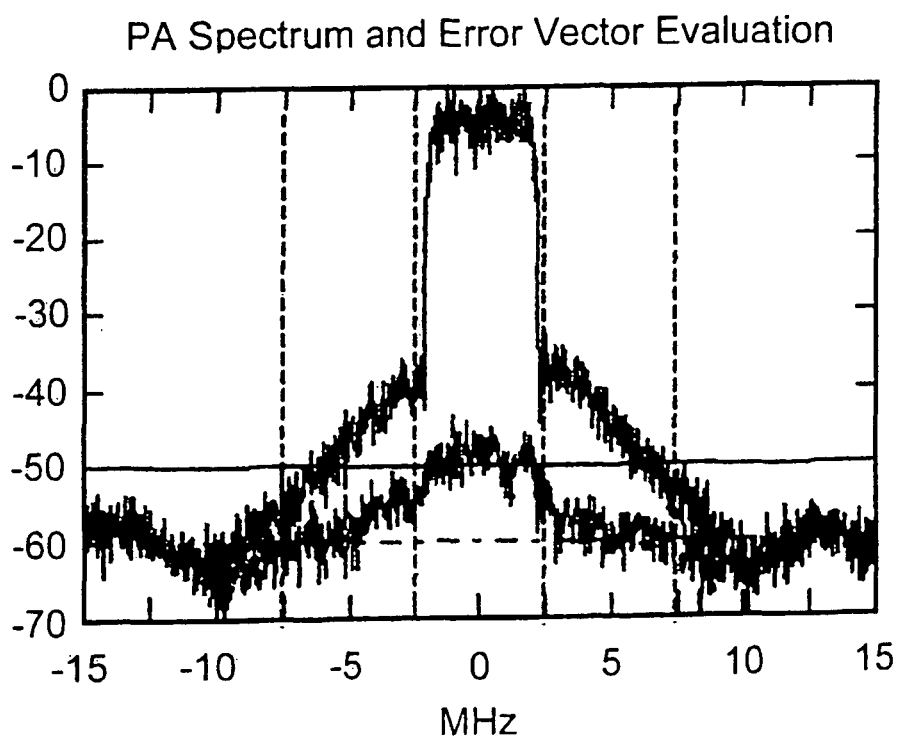
FIG. 16b illustrates error spectrum performance between the digital model and the measured device and the measured PA spectrum performance.
Figure 16C:
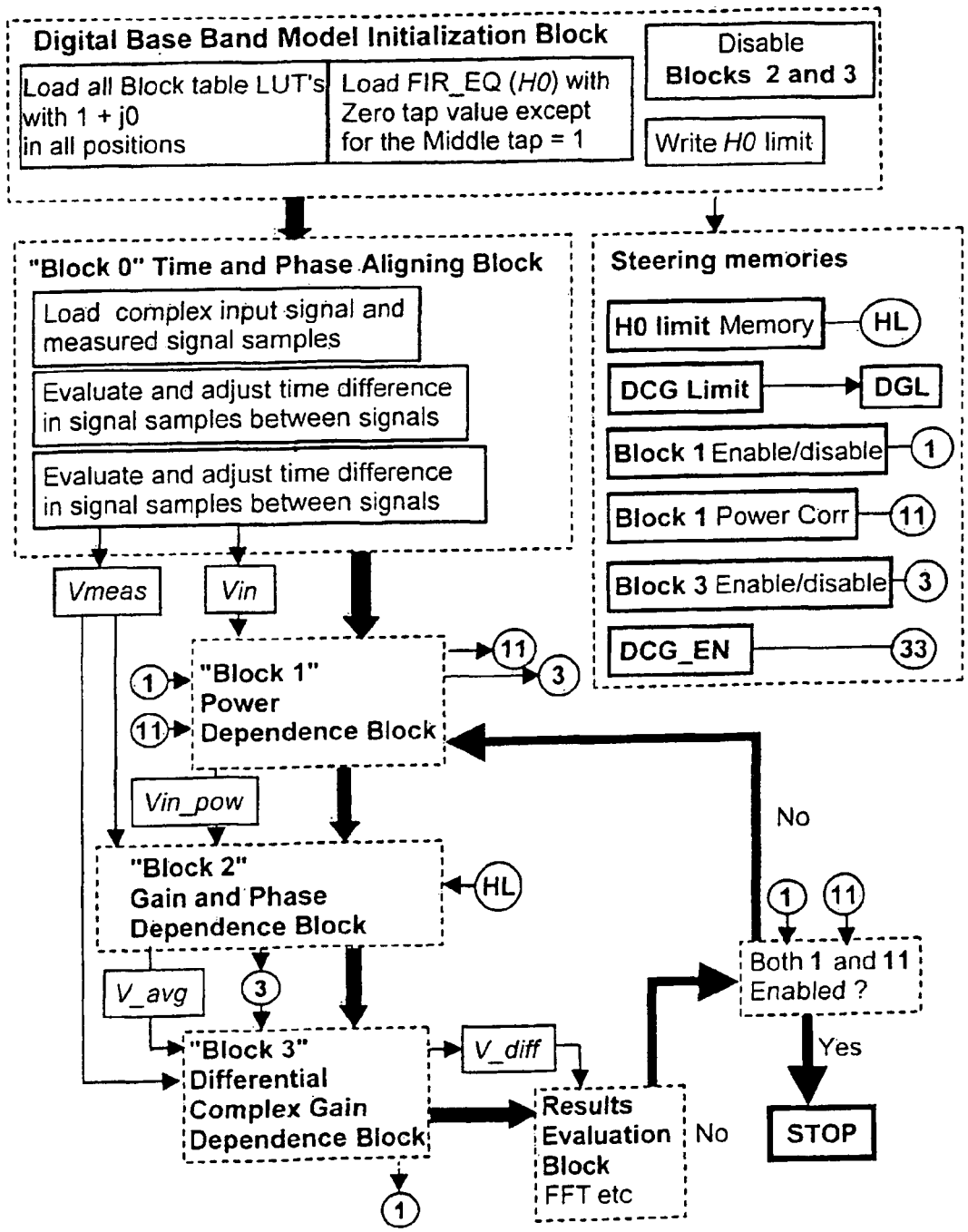
Figure 16D:
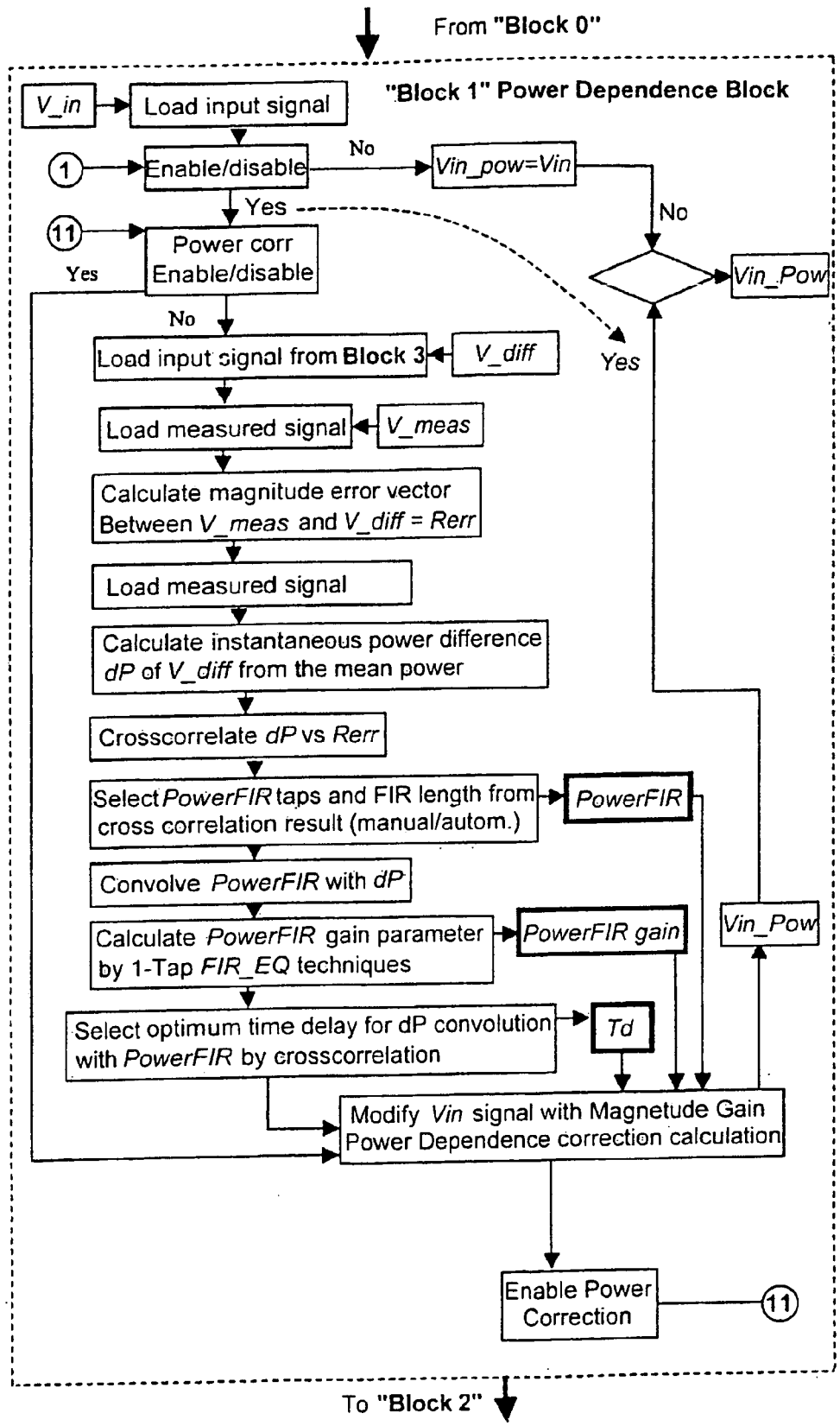
FIG. 16d illustrates the detailed calculations in "Block 1" of FIG. 16c.
Figure 16E:
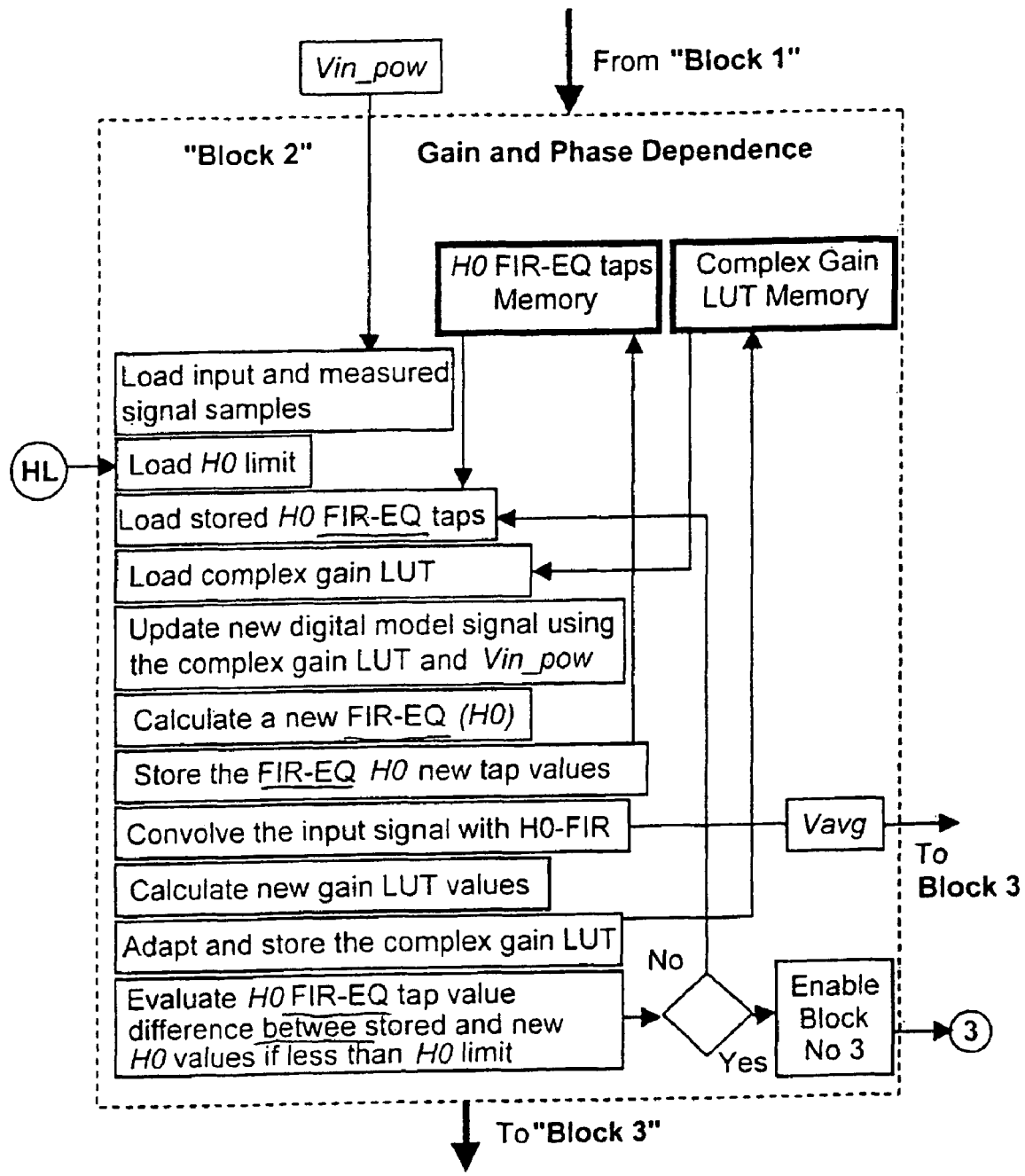
FIG. 16e illustrates the detailed calculations in "Block 2" of FIG. 16c.
Figure 16F:
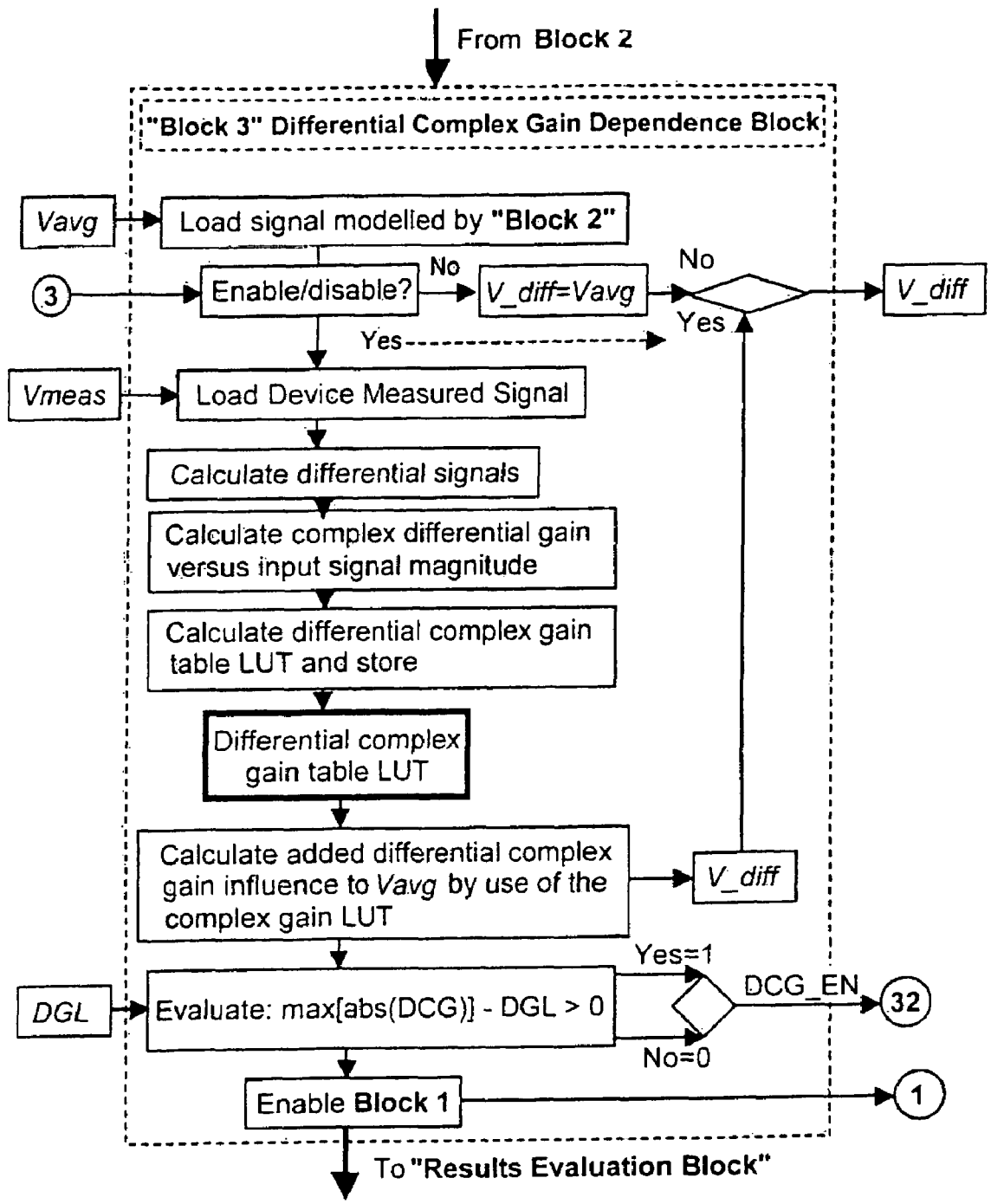
FIG. 16f illustrates the detailed calculation in "Block 3" of FIG. 16c.

FIG. 16b shows the spectrum performance achieved by this model evaluation. An improvement is seen of the digital model accuracy to the measured PA-performance by comparing the plots to FIG. 15b. THe difference in the error vector spectrum on the high and the low side of the signal is caused by the simplification of the power dependence FIR used a Hanning window filter, where the time delay can not be corrected exactly to the delay of the power dependence without doing more over sampled signals. This indicates that the measurement set-up should have higher sampling clock rate. Improvement of the result can be made by use of the cross-correlation function values as the power FIR approximation described earlier instead. Comparison with the input signal spectrum in FIG. 6a shows that the modeling errors comes very close to the spectrum limits of the measured input signal. The remaining errors are also highest within the input signal bandwidth as the power dependence correction was chosen to work mainly for the side band suppression errors. It is noted that of performing a less accurate power dependence evaluation is possible by disabling the differential gain block evaluations. FIGS. 16c to 16f illustrates the principal flow diagrams for the digital model calculations according to FIG. 16a.

Digital Signal Pre-Distorter Based on Non-Linear Device Modeling

With the preceding chapters describing the digital PA-model in mind the derivation of a new digital pre-distorter is straight forward according to the first embodiment of this invention. In the section describing FIGS. 5a-6d, the application of the inverse PA complex gain model was shown to work as a very efficient digital pre-distorter for complex gain distortion cancellation. By applying the same concept for al blocks of the derived PA-model a new digital pre-distortion circuit is proposed.

Figure 17A:
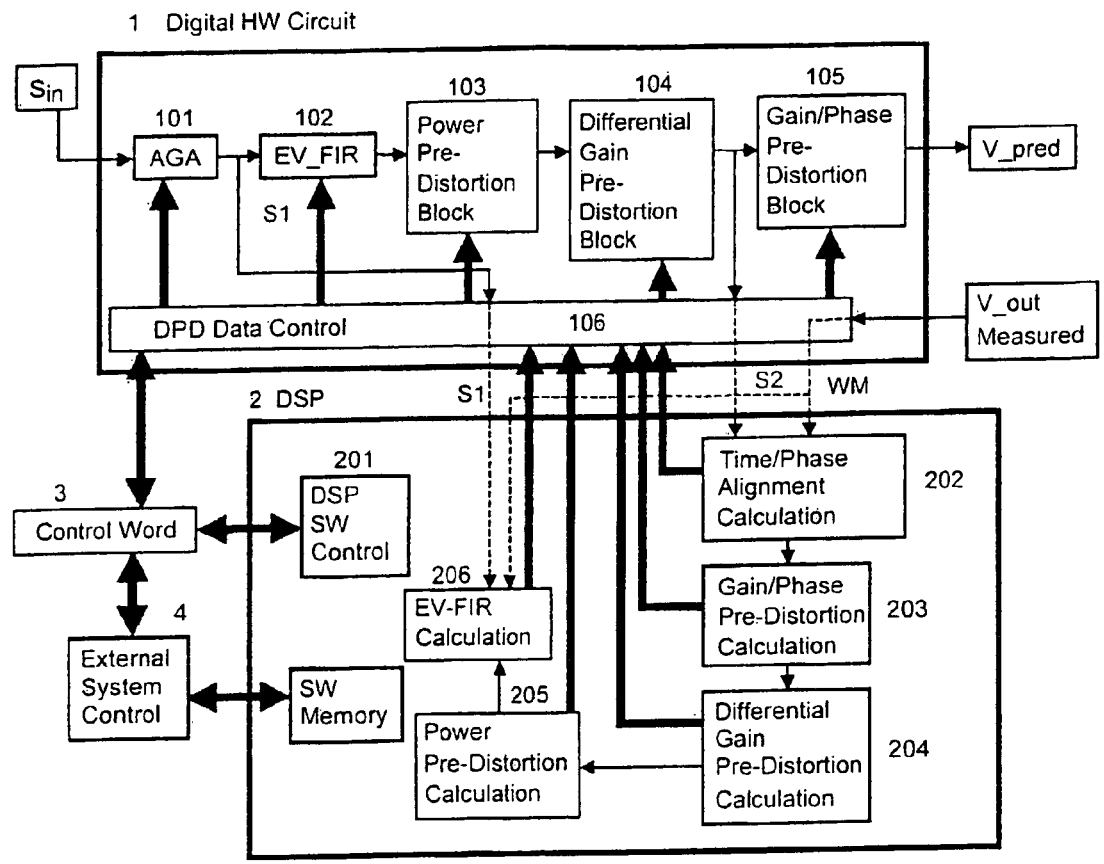
FIG. 17a illustrates a basic pre-distorter system according to the present invention.
Figure 17B:
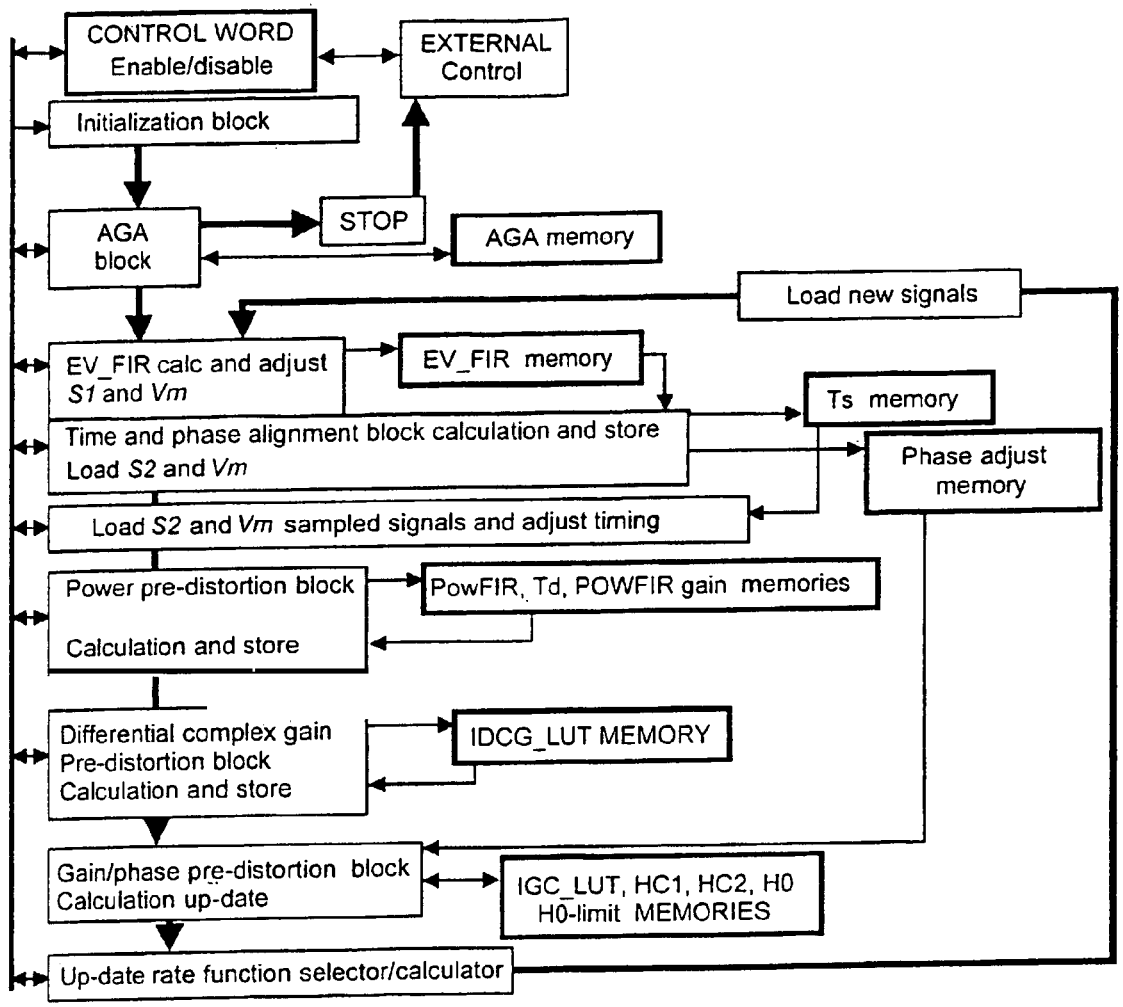
FIG. 17b illustrates the flow chart for using the basic pre-distorter system.

FIG. 17 shows the proposed digital pre-distortion circuit. The embodiment includes four basic blocks named 1, 2, 3 and 4.

The first function block 1 is the hardware digital implementation of the pre-distorter. It is the real time digital circuit with all function blocks 101 to 106 shown.

The second block 2 is the Digital signal processor used for up-dating the different parameters and look-up tables used in the pre-distorter. The different software blocks 201 to 206 are shown.

The third block 3 shown is the Control word used for controlling the system, which contains data accessible for all the other blocks shown in the picture for read and write. It can be placed in the digital HW block 1 but is shown as a separate block for the sake of clarity.

The fourth block 4 is the External System Control to monitor the system present status and up-dating it. The external control can decide if there is a calibration procedure to be done or an operation where some of the blocks in the basic pre-distorter are disabled or not by overwriting the content in the control word 3. It can be used for SW updates, signal down load etc from the DSP 2.

Basic Calibration And Initialization

For calibration purposes a known signal with approximately the same power as intended in the highest power case application is used. A basic calibration run of the system is performed to fill the tables and parameters with default data according to the active device used. The average power and the peak power in the input signal used for the power correction evaluation are preferred to be in the range of the intended usage of the system to ease the calibration and application afterwards.

When calibrating and initializing the system a basic routine is utilized. The digital real time circuit blocks for Power dependence 103 and the differential gain block 140 are disabled. This means that the signal goes through these blocks unaffected. The EV-FIR block 102 is loaded with zeros for all tap values except the middle tap, which is loaded with the value of "1". This is described in detail in the descriptions of the individual blocks later in this paper.

The Gain/Phase pre-distortion block 105 is loaded with LUT tables corresponding to a gain of 1 and phase angle of zero. The FIR-filters are loaded with center taps equal to one and the rest of the taps are zeroed. The External DSP and Pre-distorter-control block 4 initiates a digital word 5 to be read by the digital pre-distorter 1 telling the circuit to start and to use the calibration data base stored in memories inside the block 1. The parameter block for each function has three memory locations –0, 1 and 2 as an example. The first is for the initialization and is denoted the "0"-block. The DSP, which is monitoring the control word 3 starts to download signals S1 and VM from the memory in 106 and starts processing the data. When the DSP 2 has done calculations according to software blocks 202 and 203 and is ready for updating, it reads the control word 5 defining the database usage and decides where to put the updated data's. If the control word has a "0" for this position the DSP loads the new data's into a memory position called "1". When the loading is ready the DSP overwrites the "0" in the control word 3 data base pointer with a "1" telling the digital real time circuit 1 that it shall start using the new database. If the DSP already reads a "1" in the digital control word, the DSP decides to put the new updates into a position "2" and change the control word database pointer accordingly. If the DSP reads a "2" memory position it toggles back and puts the new data's in "1"-position and updates the control word 5 database pointer.

Time Phase And Gain Adjustment

A defined number of samples from the input signal S1 and the output signal VM is loaded down to the DSP. The DSP routing 201 calculates the time difference in samples and the correct phasor to be used as the correction of the Gain Table LUT and stores it for updating later. The DSP stores the time difference delay (ts) to reduce calculation time for further updates later. The DSP can also do a correction of the gain of the input signal in block 101. If too high, level of the input signal is applied to the system the DSP reports to the control word 3 that reports further to the external control 4 that can adjust some external attenuators. The control word 3 can also have the possibility to do external adjustments by itself with added interfaces and DSP functionality. The calculation of the timing and phase correction is done the same way as described in the section related to FIGS. 5a-6d. The control block 3 can be loaded with a "gain back off" factor to be used in the system to cope with the analog device gain change versus temperature and put an appropriate margin to the input signal so the signal levels inside the system never exceeds a maximum allowed value. The phase difference between the VM and the S1 signals can be incorporated into the inverse FIR-filter tap values by multiplying each complex by the correction phase value for a first adaptation. The inverse FIR-filter incorporated in 105 will adapt and correct for the slow drift in the up-converter and PA group delay and frequency response drifts.

The gain setting is preferred to be done in such a way that the pre-distorter 1 has the availability to adjust the tables within the input signal range so slow pre-distorter adaptation can be made due to the ambient temperature change of the used nonlinear device. Some type of digital signal gain back off is used and adjusted in the AGA block 101. The ambient temperature is supposed to be corrected by the adaptation of the pre-distorter. The gain back-off adjustment can also be adopted for calibrated transfer drifts in the hard ware setup-up-converters and down-converters the nonlinear PA.

Gain/Phase Pre-Distortion Block

The updating of gain table LUT's and FIR-filter Tap memories of the gain and phase equalization block 105 is calculated in the DSP block 203 in accordance to the description above. Each calculation means an update of the LUT and FIR-filter memories used in the pre-distorter 105. A measure of the performance described in later chapters is reported to the pre-distorter control 3, that updates the enabling functions in the digital control word 5 for operating the system with more functions applied. When all functions of the Gain/phase equalizer blocks have adopted to a certain performance measurement factor, the DSP according to the control word reading goes further to calculate the next block according to the settings of the control word 3.

The Differential Gain Pre-Distortion Block

The procedures of calculating this block 204 and updating of the digital part 104 can be done in two different ways depending on the DSP processor calculation power capability.

First it can be calculated by the same procedure as for the differential gain according to the magnitude and phase database shown in FIG. 11c. The updating is then done as the inverse complex gain values into the LUT A second more fast way but less accurate than the first approach is to use linear regression of the data put into the LUT-tables. Application of this procedure is dependent on the non-linear device performance.

When the DSP has done the calculation it updates the respective memory positions in 1 and writes the respective update to the Control Word 5. Adaptation of the differential gain pre-distortion block is done in the same manner as for the complex gain/phase block before proceeding to the next block.

The Power Correction Evaluation Block

The system goes further to calculate the differential power dependence according to the DSP block 205. There are at least two choices of how to do this and the procedures.

The first method is that it is done automatically. The DSP calculates all of the procedures by proper programming of the DSP. The DSP can be controlled to do an update of the power dependence periodically afterwards if the ambient temperature will affect this performance. This was outlined in the section with the heading "The Power Dependence Block". How often the dependence adaptation must be done is unspecified. The experience by applying the DPD solution according to the embodiments will give more insight to this question in the future. Adaptation of the power FIR gain factor will probably be most feasible.

The second method is that the DSP and pre-distorter control reads the control word and loads appropriate S2 and VM signals to the external control where the Power dependence FIR-filter is evaluated in another processor controlled by a human interface doing the calculations and evaluations. This is possible if the power dependence of a device is not expected to change and then it can be evaluated just once. There will probably be a failure in the actual device if the temperature dependence starts to change in the applied non-linear device. By doing the power dependence outside the system, a lot of memory location for program is saved in the DSP-block 205 in FIG. 16.

After the evaluation of the differential power dependence is done, the new data's for the FIR-filter, the delay and the weighting according to a previous chapter are loaded into the memory of the Power dependence Pre-distortion block 103 and the control word 3 is updated so the pre-distorter 1 starts to use this function.

If a Proper adjustment of the mean power value PM for the differential Power correction block and the time delay is done, the result is symmetrical side band suppression in the pre-distorter.

EV FIR Application

In some applications of the proposed DPD circuit, the error vector between the input signal and the output signal has to cancel a very low level of errors between the digital input signal and the measured output signal taking account for the up-converter frequency characteristics as the influences from the blocks 103 and 104. The FIR-filters in the Gain/phase pre-distortion block will adapt to an input signal that is modified with the power and differential gain pre-distortion applied. The use of the EV_FIR 102 is applied to correct the group delay and frequency response versus the true input signal to the system. The calculations is the same as for the later described Inverse H0 calculations used in block 105 but with the input signal S1 used instead of the S2 signal together with the measured signal VM in FIG. 17a.

For wider frequency coverage of the EV_FIR performance than the intended input signal bandwidth, the signal S1 in this case can be a wider frequency signal but with less power level to the PA and thus reducing the distortion from the active device that may effect the calculation and results from the EV_FIR tap evaluations. Even better is to use a phase modulated signal with no amplitude modulation present.

Utilizing the System

After the calibration is done the system is ready for use. The setting of the last control word 3 defines the data base for operation for the individual blocks. The calibrating data has been stored in non-destructive memory media. The system loads the data's into the DSP 2 and the pre-distorter 1 and starts running. The DSP calculates and updates the three basic blocks 101, 103 and 104 according to the control word 5 settings described already. The initial DSP control evaluation parameters are monitored by the DSP and pre-distorter control which checks the validity of the monitored parameters and put an alarm to the external control 3 if the validity limits are overdriven. As the performance of the pre-distorter dependency is relying of all DPD functions applied, multiple block adaptations may cause variations in the DPD application spectrum response instead of refining the spectrum for each adaptation. The pre-distorter gain/phase correction block shall have the highest priority for adaptation for each DSP evaluation, while the other function blocks can be updated when the gain/phase pre-distortion block agrees with the performance limit set.

Basic Outline of the Pre-Distorter Blocks

A sample outline of the four proposed pre-distortion blocks is made in this chapter. Basic for all blocks are that they have the inverse correction applied as compared to the PA-model blocks described in this paper. The difference between this outline of the new pre-distortion proposal is, that the introduced group delay of the prior art pre-distorters will be cancelled giving very small error vectors emerging from the DPD-system used in the received signal from a wireless system receiver to handle.

For the second embodiment, it should be noted that the proposed digital pre-distorter system can be modified and used as part of the MCPA system using a feed forward loop. The algorithm description is defined in a way that is operating on Error Vectors in the function blocks Therefore it is possible to achieve error cancellation in an added feed forward loop application to the basic digital pre-distorter application outlined in FIG. 22. The same algorithm can be used on a system that measures the error vector in a canceling point in a FF-system. The new invented pre-distorter also makes group delay cancellation and thus reduces the error signal to be used in a second loop Error Amplifier in a Feed Forward solution.

Phasor Multiplier

Figure 18:
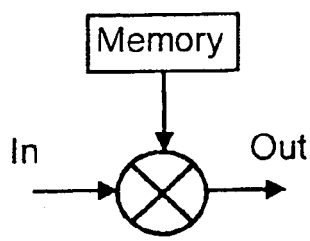
FIG. 18 illustrates the Gain/Phasor Multiplier block.

The multiplier in FIG. 18 is a complex number A+jB with the magnitude equal to "1", which is multiplied with each of the complex input signal samples to provide a phase corrected output signal. This phasor is used to make a perfect fit in rotation of the I/Q-diagrams of the used signals VM and S2 in FIG. 17. The complex number used in the memory is provided from the DSP 2 in FIG. 17. The LUT tables in 105 in FIG. 16 can be updated with the inverse complex gain multiplied with the phasor adjustment and thus reducing the hardware need. No external phasor block is then needed. The adaptive updating of the phasor is done by taking the last phasor value and multiply it with the new calculated value found by 1-Tap FIR-filter equalizing technique described before for device modeling.

Gain/Phase Equalization Pre-Distortion Block

Figure 19:
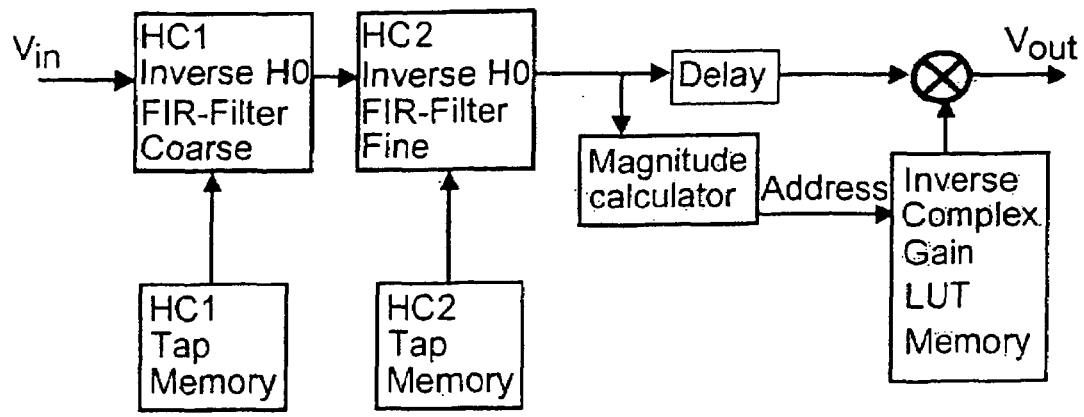
FIG. 19 illustrates the gain/phase pre-distortion function block.

The gain and phase equalization block for the final solution in FIG. 19 is changed somewhat compared to FIG. 5a. The earlier mentioned inverse H0 FIR-filter is divided into two filters HC1 and HC2, which are used for coarse and fine correction adjustment of the time and phase performance equalization or group delay cancellation. For the first optimization or adaptation run the filters with equal odd numbers of taps are loaded with zero tap values except for the middle tap which is loaded with a "1". For the first initial runs the updating is not done. When the adaptation has reduced the distortion so a more linear response is achieved, the basic linear FIR-filter algorithm will give accurate response for group delay cancellation purposes using the FIR-filters HC1 and HC2.

The optimization and adaptation of the pre-distorter inverse gain and phase goes on until a measure of performance of the used H0 in the algorithms described before is achieved. Normally the performance of the pre-distorter can be measured by evaluating the power of the error vector, but a much more efficient evaluation is described here. The measure of the optimization process is done by evaluating the improvement of the FIR-filtering, not on the gain tables in the following described way. When the calculated H0 tap values is stabilized in the adaptation it means that the pre-distorter works correctly.

The PA-model algorithm H0 filter Tap values from previous and the present adaptation for complex gain calculations are measured. The magnitude of the squared sum of difference Tap vector will be made. This measure here called "HC1_Cancel" is compared to a limit value "HC1_Cancel_Limit" in the DSP. As soon as the "HC1_Cancel" is less than the limit, the DSP starts the update the HC1 FIR-filter coefficients and uses the last HC1 filter that gave the limit satisfaction above. The following FIR-filter adaptations of the pre-distorter 2 block 105 in FIG. 17 will be done by updates or the second fine tuned FIR-filter HC2. Both complex valued filters are magnitude gain adjusted to have a gain equal to "1" at zero frequency in order not to affect the used gain tables.

The inverse H0 filter is designed by FIR-filter equalization described before reversing the signals S2 and VM in FIG. 17 in the algorithm described for device modeling discussed in the section "Gain Model For the PA Representation" in page 14 and onwards.

The two FIR-filters HC1 and HC2 are feasible, because using only the first FIR-filter HC1 may give oscillations in the adaptation when the time delays of the actual device is exceeding the actual time sampling by some fraction of the clock time. The filter HC1 preserves the correct time sampling phase adjustment so the second FIR-filter HC2 is centered in the FIR Tap response. The second FIR-filter HC2 refines the pre-distortion result and adapts for the slow changes in the system.

When the FIR-filter HC1 is used, the following adaptations will adapt the values of filter HC2 in the following manner. From the previous FIR-filter HC2, the complex FFT is calculated. The new FIR-filter HC2 complex FFT is also calculated. This goes very fast when only a few taps are used. The two FFT's are multiplied and the inverse complex FFT is done of the result. This new FIR-filter is stored as update in the system of the filter HC2. THe number of taps of the filter HC2 is preserved by this method. Direct convolution of the previous and the last FIR-filter HC2 will increase the number of taps.

The two filters in cascade will give a flat frequency response of the system response, canceling the nonlinear device response as the up-converters. For the reduction of the number of complex taps in the pre-distorter, the two filters HC1 and HC2 can be calculated in the DSP by convolution to provide updating of a single filter $HC_{tot}$ still having the desired frequency response for optimal error cancellation.

Each adaptation or calculation in the DSP will give updated LUT and filter taps in the pre-distorter. Updating of the Pre-distortion Control Word 5 in FIG. 16 is also done.

There are also possibilities to use one compensation FIR-filter $HC_{tot}$ in the application and update this filter in the same way as described for the filter HC2.

One difference for the new pre-distorter disclosed in this paper compared to prior art pre-distorters is that the filters for group delay cancellation in this block, filters HC1 and HC2, is implemented in order to be able to do further DPD function block evaluations. The other predistortion function properties will be evaluated by investigations of the error vectors and without group delay cancellation it is not possible to resolve accurate measures for those properties. The added pre-distortion functions as the "Differential Gain pre-distortion Calculation" 203 and the "Power Pre-distortion Calculation" 205 in FIG. 17a will need the low level of the group delay and magnitude errors to provide the correct applications of the function blocks 104 and 103.

The Differential Gain Pre-Distortion Block

Figure 20:
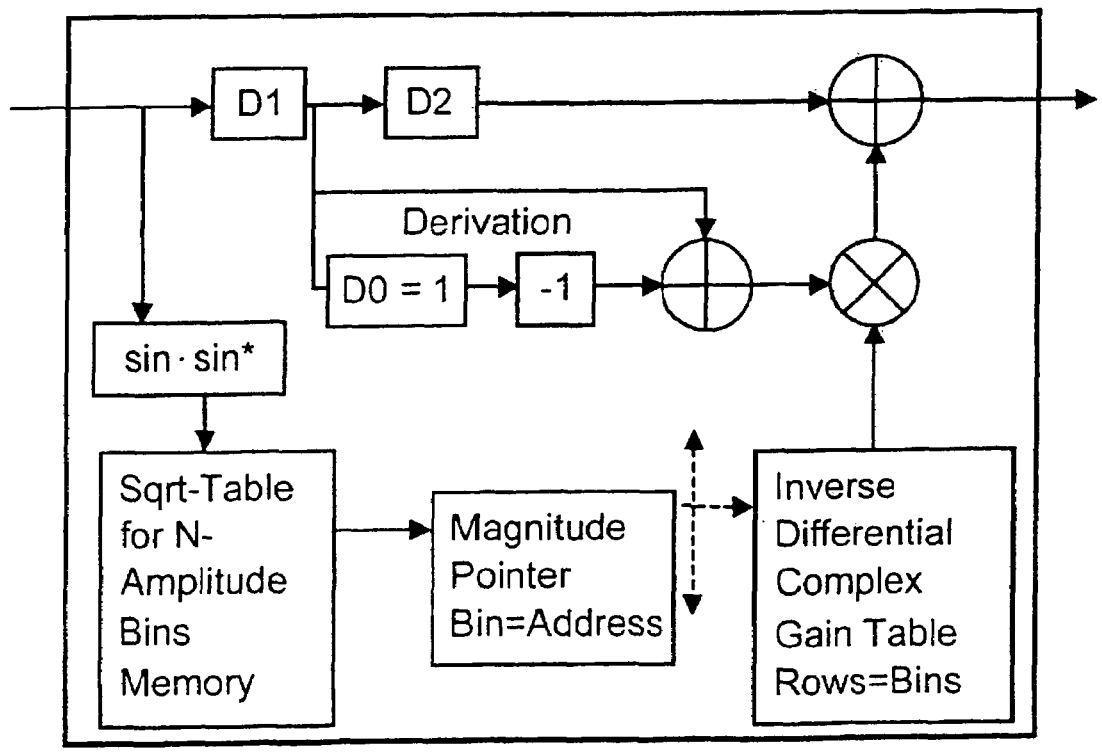
FIG. 20 illustrates the differential complex gain pre-distortion block.

After the gain and equalization block 105 in FIG. 15 calculations are done and the pre-distorter system has gone so far in the adaptation that the FIR-filter HC2 is used, the differential gain correction 104 is calculated. The updating is done to a circuit according to FIG. 20. The outline of this block is essentially the same as in FIG. 10, but the inverse differential complex gain is used in the table. The inverse differential complex gain LUT can be calculated directly or by using the inverse of the gain expression derived for the digital model work. Adaptation is done until a performance measure limit for adaptation is reached as described before.

Power Dependence Pre-Distortion Block

The Power Pre-distortion block is the same as in FIG. 14 and has the same outline as for the PA-model Pre-Distortion and applies to the following formula.

$$S_{in}1\_Power\_Correct(t) = S_{in}(t) * [1 + dP_{conv}(t+Td) * GP/(R_{in}(t)+\delta)]$$

Where GP is the Power FIR-filter gain. The sign of the factor GP will automatically be correct depending on the 1-Tap equalizing process used to find the GP-value described in earlier paragraph on page 32. "dP.sub.conv" is the convolution of the difference power dP(t)–PM in the input signal with the selected Power FIR-filter according to section "The Power Dependence Block" in page 29. Td is the power filtering response delay in time units. The shown delays, in the FIG. 14, are adjusted according to the actual digital implementation to fulfill the formula above. The enable and disable of this power function can be made by zeroing the gain factor GP or the Power FIR-filter taps as an example. The mean power value for calculating the differential power can be further optimized depending on the active device used. Some remarks of using this function are mentioned in order to achieve the best performance. If a faulty delay value "td" is used the distortion spectrum will be shifted in frequency. When a symmetrical spectrum result is achieved for the system the Power adjusting time delay td is optimal. When the lowest spectrum performance is achieved the mean power value PM is adjusted to an optimum value for the device used. Fine adjustment of the PM value may be needed when the mean power in an input signal is not the same as the mean power from a nonlinear device. When the power FIR-filter is decided, further adaptations will be to the power FIR-filter gain value.

Normal Utilized Pre-Distortion Blocks

Figure 21:
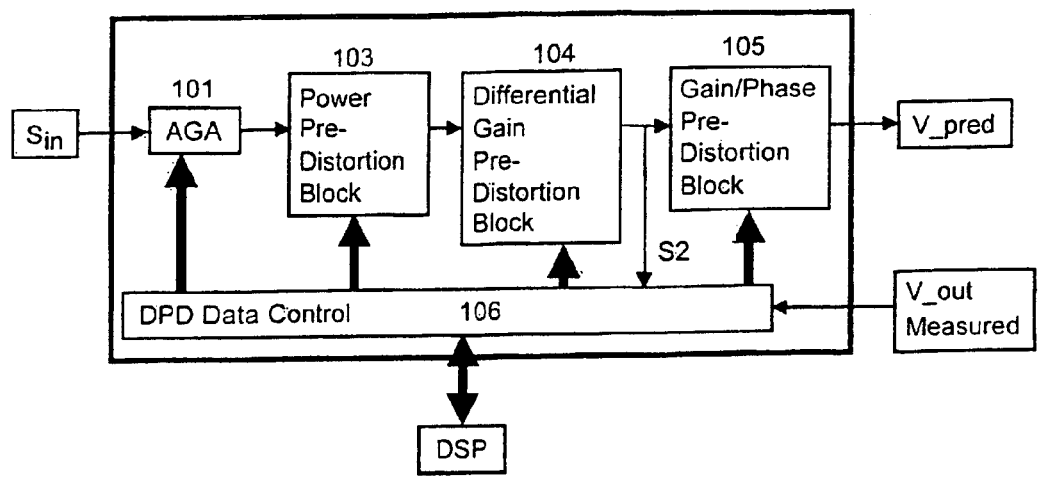
FIG. 21 illustrates the pre-distortion blocks needed for DPD application.

FIG. 21 shows the needed pre-distorter function blocks according to an application as in FIG. 2. One difference is that the EV-FIR block 102 in FIG. 17 is omitted and therefore the signal "S1" does not need to be transferred to the DSP for signal processing.

Extended Usage Of The New DPD of the Invention

Figure 22:
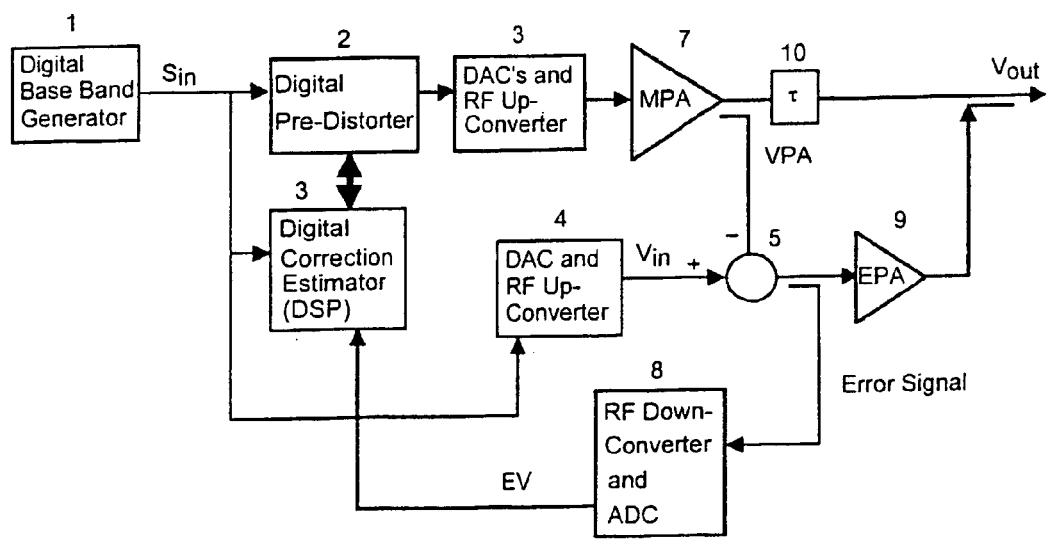
FIG. 22 illustrates the digital pre-distorter according to an embodiment applied to a combined DPD and Feed Forward MCPA application.

FIG. 22 shows a principle application of the Digital Pre-distortion circuit described by the present disclosure for a combined DPD and Feed Forward Loop MCPA. The pre-distorter function blocks shall then have the outline as in FIG. 17 including the EV_FIR 101. The added EV_FIR block in FIG. 17 minimizes the error between the true input signal S1 and the output signal. The pre-distorter FIR-filters HC1 and HC2 minimize between the modified input signal and the input signal pre-distortion containing differential gain pre-distortion.

An advantage of this solution is that the DPD embodiment is designed to minimize the error. In a canceling point in a FF design the error has to be minimized for an efficient design. The present DPD solution reduces signal levels to the error power amplifier and therefore the MCPA power consumption in that a lower power output Error Power Amplifier may be used. This combined DPD and FF-loop application can be used for MCPA applications requiring very high demands on distortion cancellation. The Feed Forward loop reduces the distortion errors further.

In FIG. 22 a complex base-band generator 1 provides a digital input signal $V_{in}$ to a digital pre-distorter 2 which is controlled by a DSP 3. The input signal is also fed to a DAC and a Reference Up-converter 4. The reference up-converter is used to provide a clean signal without distortion to a signal cancel point 5 in a FF MCPA outline. The cancel point shall only contain the remaining distortion from the Power Amplifier 7. THe DPD 2 drives a DAC and up-converter 6 providing a signal to a Main Power Amplifier 7 reducing the distortion. The output signal from the MPA 7 is sampled and provided to the canceling point 5. The output signal after the canceling point is sampled to a measurement receiver 8 measuring the Errors between the required signal and the MPA 7 signal. This signal will contain the remaining distortion from the MPA that has to be minimized. This signal is provided in digital format to the DSP 3. THe error signal is also put though an Error Power Amplifier 9 and applied in a correct anti-phase provided by the delay adjustment 10 for the EPA 9 time delay to the MCPA output which cancels the introduced delay of the Error Power amplifier. The feed forward loop then cancels the remaining distortion errors, that is present after the DPD adjustment to the MPA 7 output signal.

This application is available for the DPD in this invention. The DPD in this invention works on the error vector difference calculating the $EV = V_{PA} - V_{in}$ signal in the pre-distorter calculations and the algorithms described before in this paper. In the application according to FIG. 22, the signal EV is known and the signal $V_{in}$ is also known. Therefore the signal $V_{out}$ can be calculated and the same method as in this invention can thus be used for an application as illustrated in FIG. 22. The DPD adjusts the signal $V_{PA}$ in FIG. 22 until the errors compared to the signal $V_{in}$ at the reference point is minimized. Any introduced errors in the reference up-converter chain will remain. The DPD will adjust the up-converter frequency response to be the same as for the reference up-converter, when minimizing the errors at the cancelling point.

The application in FIG. 22 is drawn in a simplified form only to illustrate the principle. The reference chain 4 normally uses a frequency translation digital block numerically controlled oscillator NCO in the reference chain to provide the base-band input signal within the useable video frequency range of the used DAC. The used up- and down-converters will do frequency adjustment so the signals at RF-frequencies are the same by use of different local oscillators settings in the up and down converters.

The invention claimed is:

1. A method for a complex base-band adaptive digital nonlinear device model, comprising:

processing in the nonlinear device model an input complex digital base-band I/Q signal through a plurality of cascaded digital function blocks, whereby each digital function block is used to minimize an error caused by a specific type of distortion between the nonlinear device model and an actual measured device performance, each digital function block being independent of other function blocks;

time aligning a measured nonlinear device complex signal and the input complex digital base-band I/Q signal;

adjusting one of the measured nonlinear device complex signal and the input complex digital base-band I/Q signal to achieve phase alignment by multiplying one of the signals by a phase adjustment value, whereby the digital nonlinear device model includes an AM-to-AM and AM-to-PM gain look-up table memory, the look-up table memory being read using an amplitude or power value of the input complex digital base-band I/Q signal, and a look-up value being provided to a complex multiplier which multiplies each input signal sample with an complex gain correction according to a measured device characteristic; and processing the multiplied complex digital base-band I/Q signal through a digital filter describing an impulse response resembling an actual nonlinear device frequency response to an envelope modulation, wherein the digital filter is found by signal processing equalizer techniques by comparing an input complex gain corrected signal with the measured device signal, wherein a gain of the digital filter is normalized to have an amplitude gain equal to one at zero frequency; and calculating new complex gain values for adaptation by comparing a measured digital nonlinear device signal with the processed input digital signal after the digital filter, wherein the complex gain look-up table and the digital filter are optimized in an adaptive way until a predetermined limit of difference of digital filter impulse response values or complex gain values between different adaptations is reached.

2. The method according to claim 1, further comprising:
implementing a best least square phase adjustment found through a 1-tap FIR-filter equalization techniques between a digital input signal and the measured digital nonlinear device signal.

3. The method according to claim 1, further comprising:
processing the gain corrected complex digital base-band I/Q signal through a N-tap digital complex FIR-filter describing the impulse response of the actual nonlinear device frequency response to an envelope modulation provided in the input complex digital base-band I/Q signal, wherein the N-tap digital complex FIR-filter is found by signal processing equalizer techniques by comparing a complex gain adjusted nonlinear device model signal with the measured device signal, wherein the digital complex FIR-filter is normalized to have an amplitude gain equal to one at zero frequency.

4. The method according to claim 1, further comprising:
evaluating the digital nonlinear device model with a differential gain dependence block comprising a complex differential gain look-up table memory addressed by a magnitude or power of the input base-band signal to this block, a selected value from the differential gain look-up table being provided to a complex multiplier which multiples an input signal difference vector for a next sample, thereby providing a differential gain correction added to the input complex digital base-band I/Q signal at a previous sample time as a resulting output signal.

5. The method according to claim 4, further comprising:
evaluating the digital nonlinear device model against measured device characteristics for an instant power dependence of its input signal by evaluating instant difference power from a mean power of its input signal compared to remaining magnitude errors between the digital nonlinear device model and the measured device characteristics, the evaluation being performed by a cross-correlation and a cross correlation result being evaluated to find an impulse response corresponding to a measured device dependency of actual input power in an input stimuli signal and a digital filter with real impulse response values being designed form the cross correlation result, the input signal to the digital filter being a difference power from mean power of an incoming signal to this function block and gain of the digital filter being evaluated by equalizing techniques between filtered differential power signal and remaining magnitude errors, whereby a resulting signal after the digital filter is further evaluated by cross-correlation against remaining magnitude errors to find a timing difference of resulting signal; and making a magnitude correction factor to the morning signal as a multiplication of each sample with a "1" added with gain and time corrected power dependence digital filter convolution divided by the magnitude of the incoming signal.

6. The method according to claim 5, further comprising:
rearranging the digital nonlinear device model such that a power dependence function block is situated in front of an AM-AM and AM-PM function block and a differential complex gain block is situated as a last nonlinear digital device model function block, wherein look-up tables for complex gain of the digital base-band model obtains power dependence incorporated without multidimensional look-up table memories.

7. The method according to claim 6, further comprising:
having the digital nonlinear device model representation with a capability to optimize model validity for each modeled characteristic of a nonlinear device used, and using the digital base-band nonlinear device model for device characterization and supervision of manufacturing quality for device thermal mounting characteristics and bias network spread by evaluating the digital response to an incoming signal.

8. A complex base-band adaptive digital pre-distorter circuit for providing signal distortion side band suppression and memory effect compensation for an input signal envelope response dependency of a nonlinear device, comprising:

an inverse complex gain look-up table memory configured to be read using an amplitude or power of an input signal to provide an inverse complex gain correction;

a complex multiplier for multiplying the input signal with an inverse complex to produce a gain correction feeding a distorted signal provided to a nonlinear device;

a measurement receiver for sampling an output signal from the nonlinear device to provide a digital base-band output signal to be compared with the input signal;

a time alignment circuitry configured to time align the input signal and the digital base-band output signal on a sample-by-sample basis;

a phase alignment circuitry configured to phase align complex I/Q-signals in the digital signal processing by phase multiplication and alignment of the input complex digital base-band I/Q signal, wherein values adapted to an inverse complex gain look-up table memory are evaluated by calculating a complex gain of a combined digital pre-distorter and the nonlinear device, the nonlinear device including digital-to-analog converters (DAC) and up-converters, wherein a virtual complex gain table situated in a digital signal processor (DSP) memory is updated adaptively by using an adaptive virtual digital filter also in the DSP for correct weighting of the complex gain evaluations and wherein the inverse of the virtual complex gain table is loaded into the inverse complex gain look-up table in the digital pre-distorter circuit for each adaptation, wherein a performance measure of the digital pre-distorter circuit is evaluated either by comparing difference in impulse response values of the adaptive virtual digital filter in the DSP for each adaptation or a difference in complex gain values, and wherein the digital base-band output signal is an output of a digital base-band model modeling a behavior of the nonlinear device, the digital base-band model including a plurality of cascaded digital function blocks, each digital function block configured to model the distortion due to a specific distortion type, and each digital function block being independent of other digital function blocks.

9. A complex base-band adaptive digital pre-distorter circuit according to claim 8, further comprising:

a complex phase multiplier inserted into the digital predistorter circuit for multiplying the input signal complex values by a phase value for phase aligning of the signals;

a digital filter inserted in front of an inverse gain compensation function of the digital pre-distortion circuit, the digital filter being selected to have an inverse frequency response of the adaptive virtual digital filter used for complex gain table evaluations to provide added frequency response compensation of the nonlinear system, wherein digital hardware is reduced by incorporating the complex phase multiplier in the digital filter by multiplying complex impulse response values with the phase value, and wherein the inverse gain table values are provided and the digital filter impulse response values are updated adaptively by evaluating the input signal in front of the phase multiplier and the digital field with am measured output signal of the nonlinear device.

10. A complex base-band adaptive digital pre-distorter circuit according to claim 9, further comprising:

an inverse complex differential gain correction block inserted into the digital pre-distortion circuit in front of the phase multiplier, digital filter and the inverse complex gain block, wherein the inverse complex differential gain correction block comprises a complex differential gain look-up table memory addressed by a magnitude or power of the input base-band signal to this block, a selected value from the inverse differential gain look-up table being provided to the complex multiplier which multiplies an input signal difference vector for a next sample to provide an inverse differential gain correction added to the input complex digital base-band I/Q signal at a previous sample time as a resulting output signal; and an inverse differential gain look-up table memory adapted for the inverse of complex differential gain values found by evaluating a measured signal of a combined digital pre-distortion circuit, the DACs and up-converters, and the non-linear device with the input signal at the inverse complex gain table when the apparatus has adapted to a preset measured performance level for the gain phase compensation block, whereby the inverse differential complex gain block is calculated and adapted in a same manner as for the gain phase compensation block.

11. A complex base-band adaptive digital pre-distorter according to claim 10, further comprising:

a power dependence correction function block inserted as a first function block in the digital pre-distortion circuit, wherein values to be put into parameter value memories for a first function block of a digital nonlinear device model for input power dependence correction of the digital pre-distorter solution is achieved by a power dependence function being corrected with a power digital filter, which is designed with impulse response selected from a cross-correlation evaluation between a differential input power from a mean power of the input signal and the remaining magnitude errors between the input signal and the pre-distorted nonlinear device digital measurement, wherein the cross correlation values range from zero cross correlation timing up to a maximum set value of impulse response defining a chosen digital filter, whereby the gain of the power digital filter is adjusted by an equalizing method between a power dependence convolution correction and remaining magnitude errors between the input signal and the pre-distorted nonlinear device digital measurement, and a correct timing of the power dependence convolution is further evaluated by cross cancellation, wherein a power correction is made as an amplitude gain correction factor to the incoming digital signal and wherein an update rate of this function block is performed according to a need for ambient temperature dependence of the used nonlinear device and is utilized by adaptation of the power digital filter gain.

12. A complex base-band adaptive digital pre-distorter according to claim 10, further comprising:

a power dependence correction function block inserted as a function block in the digital pre-distortion circuit;

wherein for achieving values to put into parameter value memories for a first function block the digital nonlinear device model is evaluated with a power dependence FIR-filter designed with symmetrical taps from the cross-correlation evaluation having the cross correlation values from zero cross correlation timing up to a maximum value defining a center FIR-filter tap value of an impulse response, wherein when half of the impulse response is chosen the rest of the response is achieved by mirroring the tap values from the center to the end of the FIR-filter, the number of taps then being set to be an odd number and the FIR-filter becomes symmetrical around the center tap thereby reducing numerical calculations in the power correction function block to be defined, wherein parameter values for the power dependence correction function block is in the digital pre-distortion circuit, to be put into memories for the first function block of the digital nonlinear device model, and are evaluated with a power FIR-filter designed with taps selected from a cross-correlation evaluation between an input differential power and remaining magnitude errors between the input signal and the pre-distorted nonlinear device digital measurement, wherein the power dependence FIR-filter has cross correlation related values from zero cross correlation timing up to a maximum value defining a center FIR-filter tap value defining half of the power dependence FIR-filter impulse response, whereby an other half of the impulse response is chosen by mirroring the tap values around the center tap, the number of taps then being set to an odd number such that the power dependence FIR-filter becomes symmetrical around the center FIR-filter tap value thereby reducing numerical digital convolution calculations in the power correction function block to be defined, wherein the gain of the power dependence FIR-filter is adjusted by 1-tap FIR equalizing between the differential power dependence convolution and the power dependence FIR-filter and remaining magnitude errors between the input signal and the pre-distorted nonlinear device digital measurement, wherein a correct timing of the power dependence convolution is further evaluated by cross cancellation and power correction is made as an amplitude gain correction factor to the incoming digital signal, and an update rate of this function block is performed according to a need for ambient temperature dependence of the nonlinear device and is utilized by adaptation of gain of the power dependence FIR-filter.

13. A complex base-band adaptive digital pre-distorter according to claim 11 applied to a circuit including an added feel forward loop apparatus, wherein a pre-distortion up-converter mean power amplifier signal is provided to a canceling point to be compared to a digitally delayed and phase adjusted input signal provided by a reference up-converter, a resulting signal after the canceling point containing remaining errors from the pre-distortion main power amplifier is put to an error amplifier, whereby the amplified error signal is added in anti-phase to a delayed main power amplifier signal to further reduce output distortion from the apparatus, the complex base-band adaptive digital pre-distorter further comprising:

a measurement receiver for the digital pre-distortion circuit and wherein error canceling is arranged to measure a signal after the cancellation point, wherein the digital pre-distortion calculations are modified to compare the time aligned input signal modified by phase and power dependence functions with the same signal added with the canceling point signal;

an extra error compensation digital filter block placed in front of the digital pre-distortion circuit for further error vector reduction after the canceling point by comparing the time aligned input signal with the measured signal added with the time aligned input signal, wherein time delay in samples are arranged for a best performance for the apparatus by introducing appropriate digital time delay blocks in up-converters for the pre-distortion and reference signals.

14. A complex base-band adaptive digital pre-distorter circuit according to claim 8, wherein phase multiplication values are found by 1-Tap FIR equalization methods.

15. A complex base-band adaptive digital pre-distorter circuit according to claim 9, wherein the phase value for phase aligning of the signals is found by 1-tap FIR-filter equalizing methods using time sample aligned input measured signals evaluated only once.

16. A complex base-band adaptive digital pre-distorter circuit according to claim 9, wherein the digital frequency response compensating filter is an inverse N-tap FIR-filter to an N-tap virtual FIR-filter found by equalization techniques.

17. A method to linearly transform a nonlinear device, comprising:
formulating a digital base band model of the nonlinear device, wherein the digital base band model is a model of a behavior of the nonlinear device; and
determining a predistortion circuit, using the digital base band model, having an inverse functionality of the digital base band model,
wherein the act of formulating the digital base band model comprises:
deriving a plurality of distortion function blocks related to the nonlinear device, wherein each distortion function block si configured to model an effect of a particular type of distortion independent of other distortion function blocks; and
cascading the plurality of distortion function blocks.

18. The method of claim 17, wherein the act of determining the predistortion circuit comprises:
deriving a plurality of distortion correction function blocks, wherein each correction function block is complementary to a particular distortion function block such that the correction function block is configured to correct the type of disturbance modeled by the complementary distortion function block; and
cascading the plurality of distortion correction function blocks, wherein each correction function block is configured to be optimized independently of other correction function blocks.

19. The method of claim 17,
wherein the digital base band model includes a multiplier, a complex gain LUT and a FIR filter operatively connected so that an input signal is multiplied a value from the complex gain LUT and convolved by the FIR filter to generate an output signal, and
wherein the act of extracting the digital base band model comprises:
deriving tap values for the FIR filter such that the output signal of the FIR filter is substantially aligned with an actual measured output of the nonlinear device for the corresponding input signal; and
generating table values of the complex gain LUT based on the FIR filter.

20. The method of claim 19, wherein the act of deriving the predistortion device comprises deriving an inverse FIR filter, the inverse FIR filter of the predistortion device is an inverse of the FIR filter of the digital base band model.

* * * * *